United States Patent
Sato et al.

(10) Patent No.: US 7,559,823 B2
(45) Date of Patent: Jul. 14, 2009

(54) SUBSTRATE PROCESSING APPARATUS AND SUBSTRATE PROCESSING METHOD

(75) Inventors: Naoaki Sato, Toyama (JP); Shinichi Imai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/902,235

(22) Filed: Sep. 20, 2007

(65) Prior Publication Data
US 2008/0081540 A1 Apr. 3, 2008

(30) Foreign Application Priority Data
Oct. 3, 2006 (JP) .............................. 2006-271983

(51) Int. Cl.
*B24B 49/00* (2006.01)
(52) U.S. Cl. ................ 451/5; 451/11; 451/41; 451/54; 451/57
(58) Field of Classification Search ............. 451/5, 451/10, 11, 41, 54, 57, 67, 285, 287; 257/E21.224, 257/E21.228, E21.23; 156/345.12; 438/692; 134/1.3
See application file for complete search history.

(56) References Cited

U.S. PATENT DOCUMENTS

| | | | | |
|---|---|---|---|---|
| 6,376,345 | B1 * | 4/2002 | Ohashi et al. ............... | 438/542 |
| 6,488,573 | B1 * | 12/2002 | Kobayashi et al. .......... | 451/285 |
| 6,736,701 | B1 * | 5/2004 | Shue et al. .................. | 451/8 |
| 2005/0126588 | A1 * | 6/2005 | Carter et al. ................ | 134/3 |
| 2005/0159082 | A1 * | 7/2005 | Sakurai et al. ............. | 451/11 |
| 2005/0159085 | A1 * | 7/2005 | Scott .......................... | 451/41 |
| 2006/0063373 | A1 * | 3/2006 | Gambino et al. ............ | 438/622 |
| 2007/0123047 | A1 * | 5/2007 | Shirasu et al. .............. | 438/692 |

FOREIGN PATENT DOCUMENTS

| | | |
|---|---|---|
| JP | 2002-093760 | 3/2002 |
| JP | 2005-109094 | 4/2005 |

* cited by examiner

*Primary Examiner*—Eileen P. Morgan
(74) *Attorney, Agent, or Firm*—McDermott Will & Emery LLP

(57) ABSTRACT

The substrate processing apparatus relating to the present invention comprises a polishing section where wafers are sequentially arranged, and that has multiple polishing platens for polishing a metal film on the wafer surface in stages. The wafers are simultaneously conveyed between the polishing platens by a rotating head mechanism. Further, the wafers polished by the polishing platen for the final stage polishing are sequentially conveyed to a cleaning section and are cleaned. The wafers from the polishing section to the cleaning section are conveyed by a load-unload unit, a post-polishing wafer reversal unit and wet robots. Then, the operation of each part is controlled by an apparatus controller to start the cleaning processing of the polished wafers by the polishing platen for the final stage polishing within a predetermined time period from the completion of polishing by the polishing platen for the final stage polishing. With this control, corrosion to wiring containing corrodible metal, such as copper, can be assuredly prevented.

11 Claims, 12 Drawing Sheets

SUBSTRATE PROCESSING APPARATUS AND SUBSTRATE PROCESSING METHOD

CROSS-REFERENCE TO RELATED APPLICATION

The present application claims the benefit of patent application number 2006-271983, filed in Japan on Oct. 3, 2006, the subject matter of which is incorporated herein by reference.

BACKGROUND OF THE INVENTION

1. Field of the Invention

The present invention relates to a substrate processing apparatus and a substrate processing method, and particularly relates to a technology for preventing surface abnormalities and corrosion in metal wiring from being formed using chemical mechanical polishing.

2. Description of the Related Art

Metal wiring is widely used as wiring to compose a semiconductor integrated circuit device (hereafter, referred to as a semiconductor device). Conventionally, the metal wiring has been formed by means of a metal film deposited onto a silicon substrate (wafer) with the application of lithography technology and etching technology. This type of metal film includes aluminum (Al) alloy film and tungsten (W) film by sputtering technology.

Associated with recent high-integration of semiconductor devices, in the metal wiring formed using the above technique, increased wiring resistance associated with a reduction of wiring width becomes remarkable. Particularly in sophisticated logic LSIs (large scale integrated circuits), the increase of the wiring resistance is a significant factor interfering with performance. In semiconductor devices with 0.13 μm or less of minimum wiring line width, metal wiring using copper (Cu) the electric resistance of which is approximately one-half of that of Al alloy, and whose electro-migration resistance is approximately 10 times higher than that of the Al alloy is noticed, and actually used.

Because the vapor pressure of a Cu halogenated compound is low, it is difficult for Cu to process by dry etching, which has been historically used. Consequently, for the formation of Cu wiring, a process to polish back (in a so-called dual damascene process) using a chemical mechanical polishing (CMP) method is used. In this process, after a Cu film is deposited onto an insulating film where a via-hole and a trench is preformed, an unnecessary Cu film outside the via-hole and the trench is removed by CMP processing and Cu fills the via-hole and the trench. Furthermore, an adhesion layer, such as tantalum nitride (TaN) film, for preventing the Cu film from peeling off, and a barrier metal, such as a tantalum (Ta) film, for preventing diffusion of Cu into the insulating film, are sequentially deposited as a lower layer of the Cu film.

In the mass-production process for the semiconductor devices equipped with copper wiring, in order to improve production capability, use is made of a CMP apparatus equipped with multiple platens. For example, in a CMP apparatus equipped with two polishing platens, a Cu film is polished up to a boundary surface with a barrier metal or a boundary surface the adhesion layer by a first polishing platen. In this case, any remaining barrier metal and an adhesion layer are polished by a second polishing platen. Further, in a CMP apparatus equipped with three polishing platens, a Cu film is polished halfway by the first polishing platen, and the Cu film is polished up to a boundary surface with a barrier metal surface or the boundary surface with an adhesion layer by the second polishing platen. In this case, any remaining barrier metal and adhesion layer are polished by the third polishing platen. As described, in a CMP apparatus equipped with multiple polishing platens, a method where different stages of polishing are conducted in parallel and consecutively by the polishing platens is often adopted. Furthermore, in this CMP apparatus, the polishing slurry used for each polishing platen is different.

In each polishing platen, after polishing is complete, ultrapure water is supplied to the wafer surface. After the polishing slurry on the wafer surface is removed to some extent by the ultrapure water, the wafer is conveyed to the next polishing platen and polishing is conducted in the next stage. Further, after CMP processing where the final stage polishing has been completed, the wafer is cleaned by a cleaning section, which is integrally constructed with the CMP apparatus, or a cleaning apparatus, which is a separate body from the CMP apparatus.

In cleaning after CMP processing, in order to assuredly remove particles remaining on the wafer surface, it is essential to convey a polished but not-dried wafer to the cleaning section (cleaning apparatus) for cleaning. Therefore, a mechanism is arranged where the ultrapure water is sprayed onto a wafer from a nozzle in a route where a wafer is conveyed.

In the copper wiring formation process described above, it is necessary to prevent corrosion of the copper wiring during CMP processing or after the completion of CMP processing. As the corrosion of the copper wiring, reference can be made to corrosion caused by an oxidant contained in a polishing slurry, and electrochemical corrosion due to a cell action in a closed circuit composed of a metal pattern of a lower layer, PN junction and a polishing slurry. In order to prevent this corrosion, a rust-proofing treatment is applied to the copper wiring by coating a corrosion inhibitor onto the wafer surface. The rust-proofing treatment may be conducted immediately after the polishing slurry on the wafer surface is removed to some extent by the ultrapure water after polishing is complete. However, in the mass-production process of the semiconductor devices, due to the restriction of throughput, polishing slurry where the corrosion inhibitor is added, such as BTA (Benzo-Tri-Azole: $C_6H_5N_3$), is used, and rust-proofing treatment is applied at the same time as polishing. Because of the rust-proofing treatment, if the CMP apparatus is normally shielded from light, the corrosion of the copper wiring can be prevented to some extent, which is problematic for practical use.

In the meantime, when the copper wiring is exposed to light while it is wet, it is known that photocorrosion occurs on the copper wiring. To prevent this, various technologies to prevent the photocorrosion of the copper wiring are proposed. For example, Japanese Unexamined Patent Application Publication 2002-93760 proposes a method where when a polished wafer is conveyed to a cleaning apparatus, a solution containing a corrosion inhibitor, such as BTA, is supplied to the wafer that is in reserve for conveyance. With this technique, the surface of the completely polished wafer is retained while it is wet with the solution containing a corrosion inhibitor. Consequently, it is said that even when the wafer is exposed to light, corrosion of the copper wiring can be prevented.

Further, Japanese Unexamined Patent Application Publication 2005-109094 proposes another technique where multiple illuminometers are arranged within a processing section, such as a polishing section or a cleaning/drying section where a wetting processing is applied while the copper wiring is exposed to the wafer surface, and the luminance is monitored in real time. In the technique, if any of the illuminometers detects brightness that exceeds, for example, 50 1x, the wetting processing for the processing section exceeding 50 1x is stopped. Consequently, the wetting processing will never be continuously applied in the light exposure state, preventing the mass generation of corrosion defects.

SUMMARY OF THE INVENTION

However, even when the technology disclosed in Japanese Unexamined Patent Application Publications 2002-93760 or 2005-109094 is applied, the corrosion of the copper wiring cannot completely be prevented. FIG. 11 is a graph showing the relationship between an elapsed time after the completion of the final stage of polishing and a production yield. Here, the definition of the production yield is a total number of devices on a wafer within the electrically/mechanically applied specification scope, expressed in terms of a percentage to the entire quantity. Furthermore, in FIG. 11, the horizontal axis corresponds to the elapsed time after the completion of polishing, and the vertical axis corresponds to the normalized production yield. Further, data shown in FIG. 11 is acquired in a situation where complete shielding is realized, and the ultrapure water is supplied to the completely polished wafer as described above.

According to FIG. 11, it can be understood that the production yield decreases associated with an increase of the elapsed time after the final stage polishing is completed. In particular, when the elapsed time reaches 5 minutes (300 seconds) or longer, the production yield greatly decreases. As described above, even in as state where the CMP apparatus is completely shielded and no photocorrosion of the copper wiring occurs, the corrosion of the copper wiring occurs. The corrosion does not occur after the initial or intermediate stage of polishing, but tends to occur after the final stage polishing of the wafer surface is completed.

As a result of analyzing this phenomenon, the present inventors discovered the following. The copper wirings before the completion of the final stage polishing in the CMP processing are electrically connected via the metal remaining on the wafer surface (Here, a copper film, barrier metal and adhesion layer). In the meantime, the copper wirings where the final stage polishing has been completed have no metal film on the wafer surface and they are electrically disconnected, respectively. In other words, electrically-floating copper wirings exist in the completely polished copper wirings. Consequently, the copper wirings may become electrically unstable, and corrosion easily occurs.

FIG. 12A and FIG. 12B are pattern diagrams showing an occurrence mechanism of corrosion under the shielded condition described above. Furthermore, in FIG. 12A and FIG. 12B, descriptions of about a lower layer structure existing in the lower layer of an interlayer insulating film where the copper wiring is formed are omitted. Also, the adhesion layer and the barrier metal are included in the copper wiring in the diagrams.

As shown in FIG. 12A, a wafer 121 where the final stage polishing has been completed has a structure where copper wiring 124 is buried into a trench 123 formed in an interlayer insulating film 122 made from an oxide film. When the final stage polishing is complete, the copper film, the barrier metal and the adhesion layer deposited onto a portion other than the trench 123 in the interlayer insulating film 122 are removed, at which time copper wiring 124 not electrically connected to the lower layer structure via a via-hole becomes electrically floating. When the ultrapure water is supplied to the wafer surface in this state, a water molecule 125 makes contact with the surface of the copper wiring 124. Since the water molecule 125 is polarized, electrons of the copper atoms comprising the copper wiring 124 are deprived by the water molecular 125. Cu atoms where the electrons have been deprived as described above become ionized and are dissolved in the ultrapure water. As a result, as shown in FIG. 12B, a deficiency defect 127 occurs to a portion of the copper wiring 124. Furthermore, the copper ions 126 dissolved in the ultrapure water are joined with oxygen atoms (at the negatively polarized side) in the water molecule 125.

When the diameter of the deficiency defect 127 is, for example, almost the same as the wiring width, resistance may increase or disconnection may occur to the copper wiring 124. Further, even when the diameter of the deficiency defect 127 is smaller than the wiring width, if power is applied after the copper wiring 124 is electrically connected with an upper layer wiring to be a formed later, it is possible to agglutinate the deficiency defect 127 and to cause the disconnection of the wiring.

Consequently, a wafer where the final stage polishing has been completed makes contact with the ultrapure water for a long time, the corrosion of the copper wiring occurs. As described above, while the polished wafer is held in reserve for conveyance to the cleaning section, its surface is maintained wet with the ultrapure water. When the time period to attach to the ultrapure water becomes longer, the corrosion occurs on the copper wiring. It is difficult to prevent corrosion from occurring in the shielding state even when the techniques proposed in Japanese Unexamined Patent Application Publications 2002-93760 and 2005-109094 are applied, which is particularly problematic in a process using recent detailed design rules or in a next generation process where miniaturization is further in progress.

The present invention has been proposed by taking the conventional circumstances into consideration, and its objective is to provide a substrate processing apparatus and a substrate processing method for certainly preventing corrosion due to ultrapure water from occurring on wiring containing corrodible metal, such as copper.

In order to resolve the problems, the present invention has adopted the technical means mentioned below. First, the present invention presumes a substrate processing apparatus that polishes an object to be processed where a metal film is formed on a surface to be polished using chemical mechanical polishing, and that consecutively cleans the polished object. Then, the substrate processing apparatus relating to the present invention comprises a polishing section where the objects to be processed are sequentially arranged, and that has multiple polishing platens to polish a metal film on the objects in stages, respectively. The objects to be processed are simultaneously conveyed between the polishing platens by a polishing section conveyance unit. Further, the completely polished object, which has been polished by the polishing platen for the final stage polishing, is sequentially conveyed to the cleaning section and the completely polished object is cleaned. The completely polished object is conveyed from the polishing section to the cleaning section by an intermediate conveyance unit. The operation of the polishing section, the cleaning section, the polishing section conveyance unit and the intermediate conveyance unit is controlled by an apparatus control unit so as to start the cleaning processing for the completely polished object within a predetermined time period from the completion of polishing by the polishing platen for the final stage polishing.

According to the present configuration, cleaning is started within a predetermined time after the final stage polishing is completed, i.e., an unnecessary metal film on the surface of the object is removed. Therefore, the time period to supply the ultrapure water onto electrically-disconnected wiring (metal film) formed on the surface of the object can be kept within a predetermined time. As a result, corrosion on the wiring can be restrained. Here, the predetermined time period can be set based upon the dependency of the production yield upon the elapsed time from the completion of polishing by the polishing platen for the final stage polishing.

In the configuration, when the cleaning section comprises multiple cleaning units to clean the completely polished object in stages, the apparatus control unit can implement the polishing using the each polishing platen under the polishing condition where a polishing time period by the polishing platen for the final stage polishing is longer than that by the other each polishing platen. At the same time, it can implement the cleaning of the completely polished object using each cleaning unit within a cleaning time period without occurrence of conveyance reserve of the completely polished object between the cleaning units. In addition, the apparatus control unit periodically operates the polishing section, the cleaning section, the polishing section conveyance unit and the intermediate conveyance unit under condition where a time period from the start of polishing for the object by the polishing platen for the final stage polishing until the completion of the conveyance of the completely polished object to the cleaning section is longer than a cleaning time period in the cleaning unit for the first cleaning processing and a ratio of both time periods is an irrational number. With this configuration, because the object where the final stage polishing has been completed can be conveyed in the shortest time, wiring corrosion can be restrained.

Further, in this configuration, it is preferable to further comprise an abnormality detection unit that detects an abnormality on the conveyance route for the completely polished object at the downstream side from the polishing platen for the final stage polishing. With this configuration, when an abnormality is detected on the conveyance route for the completely polished object, the start of polishing by the polishing platen for the final stage polishing can be put in reserve, and continuous wiring corrosion can be prevented. Abnormalities, for example, can be detected based upon an operation start time and an operation completion time for each part on the conveyance route for the completely polished object at the downstream side from the polishing platen for the final stage polishing. Further, when the abnormal detection unit detects an abnormality, a unit to issue an alert can be further comprised.

Further, in order to start the cleaning processing of the completely polished object, where the final stage polishing has been completed by the polishing platen for the final stage polishing, within a predetermined time period from the completion of polishing by the polishing platen for the final stage polishing; the apparatus control unit can adopt another configuration to change the polishing condition for each polishing platen. In this case, the substrate processing apparatus is further comprises a unit that acquires an expected polishing completion time to polish the objects by the each polishing platen and a unit that calculates a time difference between the expected polishing completion time by the polishing platen for the final stage polishing and an expected polishing completion time by the other each polishing platen. Then, if the time difference is not within an allowable range corresponding to the predetermined time period, the apparatus control unit changes the polishing condition for the polishing platen for the final stage polishing. Alternatively, the apparatus control unit changes the polishing condition for the other each polishing platen. Furthermore, another configuration can be adopted where if the time difference is not within an allowable range corresponding to the predetermined time period, the polishing is stopped.

In addition, another configuration to further comprise a final stage conveyance unit that conveys the completely polished object where the final stage polishing is completed to a next position, independently from the polishing section conveyance unit, can also be adopted. In this case, the apparatus control unit controls the operation of the polishing section, the cleaning section, the polishing section conveyance unit, the intermediate conveyance unit and the final stage conveyance unit in order to start the cleaning processing of the completely polished object, where the final stage polishing has been completed by the polishing platen for the final stage polishing, within a predetermined time period from the completion of polishing by the polishing platen for the final stage polishing. In addition, a unit can be further comprised that supplies ions containing solution onto an entire polished surface of the object where the final stage polishing has been completed by the polishing platen for the final stage polishing.

In the meantime, from another perspective, the present invention can provide a substrate processing method which is suitable for polishing an object to be processed where a metal film is formed on a surface to be polished, using chemical mechanical polishing and for consecutively cleaning the polished object. In other words, in the substrate processing method relating to the present invention, first, objects to be processed are sequentially arranged onto multiple polishing platens for polishing a metal film in stages, and the objects are polished in stages. Then, the cleaning processing for the completely polished object which has been polished by the polishing platen for the final stage polishing is started within a predetermined time from the completion of polishing by the polishing platen for the final stage polishing, by which method wiring corrosion can be restrained.

Further, when the cleaning step is comprised of a plurality of cleaning processings to be implemented in sequence by different cleaning units, it is preferable to implement the polishing using each polishing platen under the polishing condition where a polishing time period by the polishing platen for the final stage polishing becomes longer than that by the other each polishing platen. At the same time, the plurality of cleaning processings is implemented within a cleaning time period where there is no conveyance reserve to the completely polished object between each cleaning processing. At this time, the polishing step and the cleaning step are implemented under the condition where a time period from the start of polishing for the object by the polishing platen for the final stage polishing until the completion of the conveyance of the completely polished object to the cleaning unit for the first cleaning processing is longer than a cleaning time period for the first cleaning processing and the ratio of both time periods is an irrational number.

In addition, if the time difference between an expected polishing completion time to polish the object by the polishing platen for the final stage polishing and an expected polishing completion time to polish the object by the other each polishing platen is not within the allowable range corresponding to the predetermined time period, the cleaning processing may be started within the predetermined time period by changing the polishing condition for the other each polishing platen. Particularly, due to the different structures of surfaces to be polished, if the first cleaning processing cannot be started within the predetermined time period even changing the polishing condition for the other each polishing platen, it is preferable to allocate each object to lots which will never be consecutively processed, respectively.

With the present invention, a time period to attach the object to be processed where the final stage of polishing has been completed to ultrapure water can be predetermined. As a result, a yield reduction that increases associated with an increase of the attachment time to the ultrapure water can be restrained. Further, even if the ultrapure water attachment time exceeds the predetermined time period, continuous yield reduction can be prevented.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Embodiments of the present invention are described in detail hereafter, with reference to the drawings. Furthermore, in the embodiments, the present invention is realized according to embodiments where copper wiring is formed on a wafer. Also, in the embodiments mentioned below, chemical mechanical polishing include a method using a standard polishing pad and floating grains, a method using abrasive grains, and an intermediate method between both methods. Further, the present invention is applicable not only to the wiring formation using the damascene method or the dual damascene method but also to the contact structure formation, such as a metal plug.

First Embodiment

Figure 1:
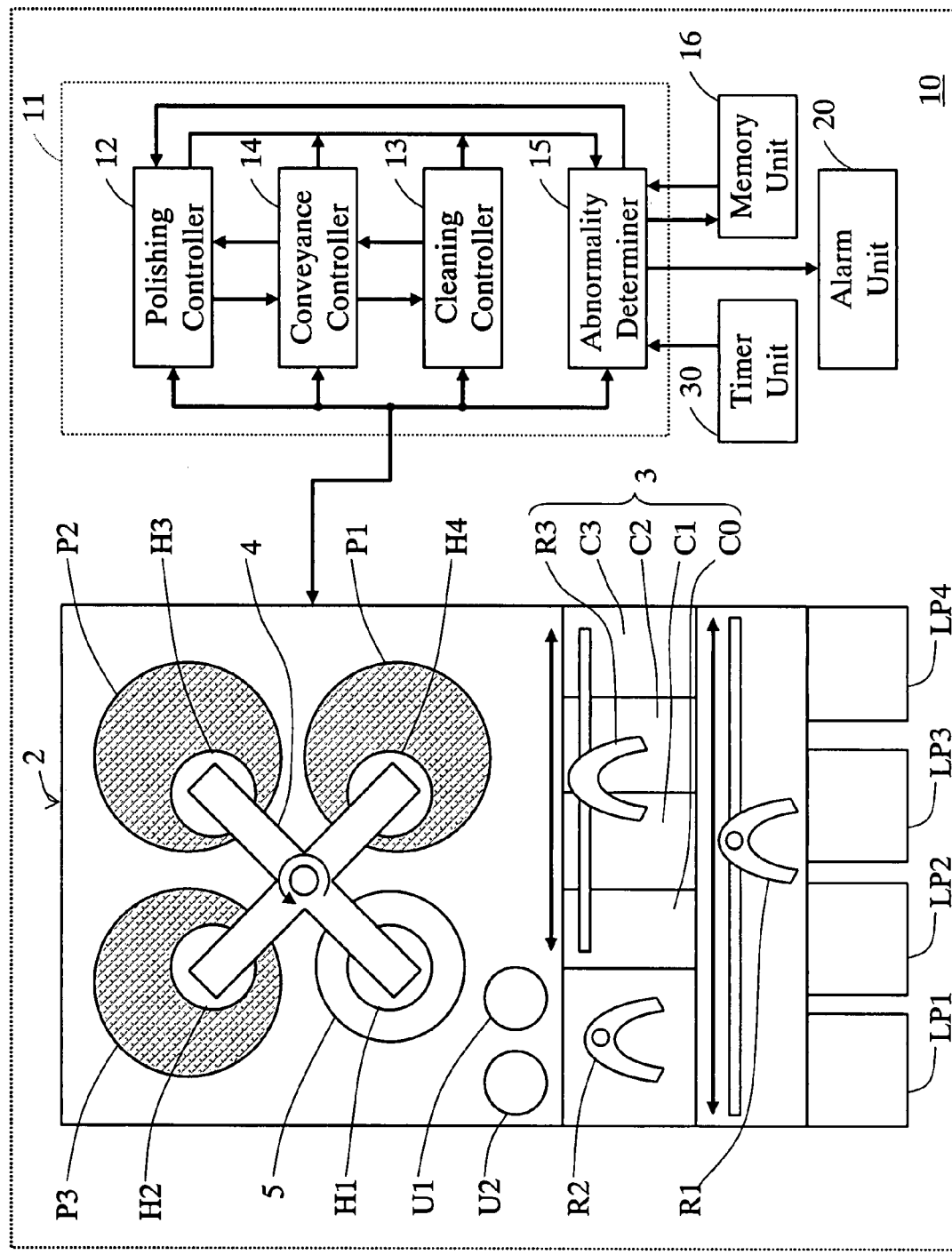
FIG. 1 is a schematic block diagram showing a substrate processing apparatus in the first embodiment relating to the present invention.

FIG. 1 is a schematic block diagram showing the substrate processing apparatus in the first embodiment relating to the present invention. As shown in FIG. 1, a substrate processing apparatus 10 in the present embodiment includes a polishing section 2 that polishes wafers and a cleaning section 3 that cleans the wafers polished by the polishing section 2. The cleaning section 3 is arranged adjacent to the polishing section 2, and a wet robot R2 that conveys the wafers is arranged at the position adjacent to both of the polishing section 2 and the cleaning section 3. Further, a dry robot R1 that is movable along the wet robot R2 and the cleaning section 3 is arranged at the position, which is the opposite side from the polishing section 2, across the cleaning section 3 and the wet robot R2. In addition, multiple load ports LP1, LP2, LP3 and LP4 where containers, such as FOUP (front opening unified pod), containing the wafers, are detachably arranged in positions which are on the opposite side from the cleaning section 3 and the wet robot R2, across from the dry robot R1. Furthermore, the dry robot R1 conveys the wafers from the containers arranged in the load ports LP1 to LP4, respectively, and conveys the wafers to the wet robot R2. Further, the dry robot R1 conveys the wafers from a drying unit C3 described below, and conveys the wafers in the containers arranged in the load ports LP1 to LP4, respectively. The wet robot R2 conveys the wafers received from the dry robot R1 to the polishing section 2, and at the same time, conveys the wafers polished in the polishing section 2 to the cleaning section 3.

The polishing section 2 is equipped with three polishing platens P1, P2 and P3 where wafers which are objects to be processed are sequentially arranged, and which polish metal films (Here, an adhesion layer made from TaN, a barrier metal made from Ta and a Cu film) deposited onto the wafers, in stages. In this substrate processing apparatus 10, the Cu film is polished partway by the first polishing platen P1, and the remaining Cu film is polished up to a boundary surface with the barrier metal by the second polishing platen P2. Then, the barrier metal and the adhesion layer are polished by the third polishing platen P3.

The polishing platens P1, P2 and P3 and a load-unload unit 5 are arranged on the same circumference by centering an axis of rotation of a rotating head mechanism (polishing section conveyance unit) 4. The rotating head mechanism 4 has four arms that radially extend from the axis of rotation at equal angles, and is equipped with heads H1, H2, H3 and H4 at the end of each arm. The heads H1 to H4 have a construction that independently enables an up-and-down movement and a rotation movement within a plane in parallel to the polishing platens P1 to P3, respectively. When the rotating head mechanism 4 is rotated, each head rounds the first polishing platen P1, the second polishing platen P2 and the third polishing platen P3 in sequence while each head retains the wafer, and then, the polishing processing is implemented.

Furthermore, the substrate processing apparatus 10 moves the wafers to the multiple polishing platens P1 to P3 and the load-unload unit 5 by a set of the rotating head mechanism 4. Therefore, the wafers are moved in the state where processing in the polishing platens P1 to P3 and the load-unload unit 5 is all completed. Further, the substrate processing apparatus 10 conveys the wafer while the surface to be polished faces upward. Consequently, a pre-polishing wafer reversal unit U1 and a post-polishing wafer reversal unit U2 are arranged between the wet robot R2 and the load-unload unit 5. The pre-polishing wafer reversal unit U1 functions to reverse two sides of the conveyed wafer, and to convey the wafer to the load-unload unit 5. The post-polishing wafer reversal unit U2 functions to convey the polished wafer from the load-unload unit 5 and to reverse the two sides of the wafer.

Figure 2:
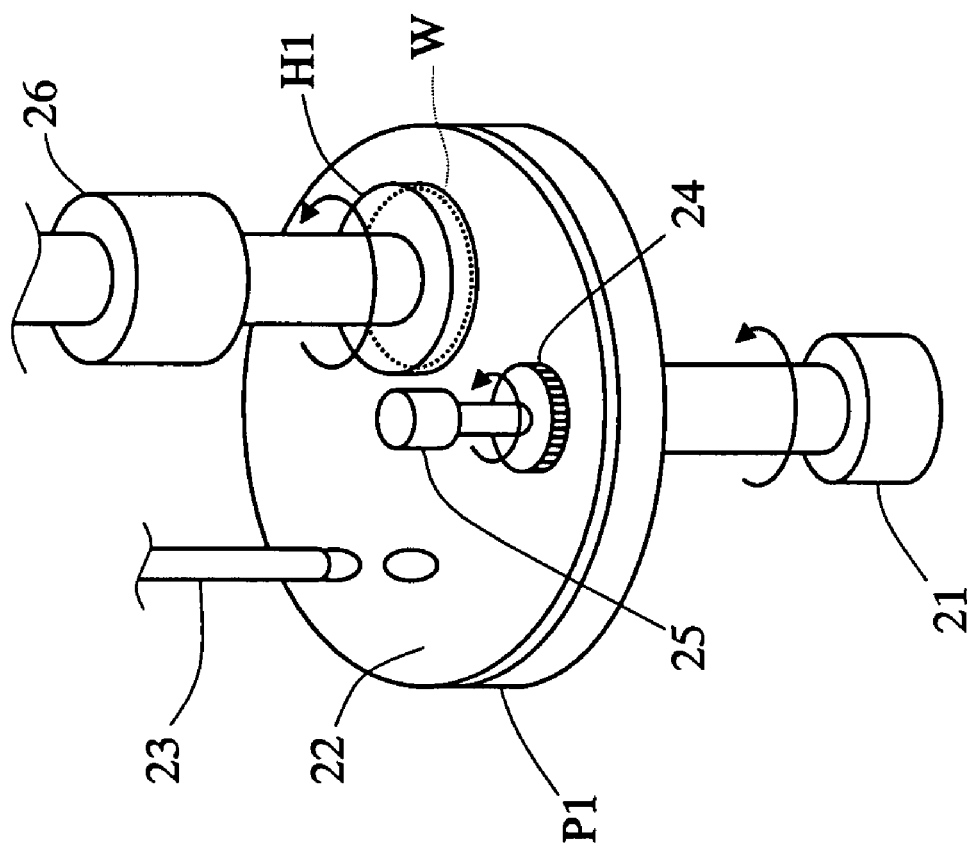
FIG. 2 is a schematic perspective view showing a main configuration of a polishing section.

FIG. 2 is a schematic perspective view showing the main construction of the polishing section 2. FIG. 2 shows the situation where the head H1 is positioned on the first polishing platen P1. As shown in FIG. 2, the first polishing platen P1 is rotatably configured around the center of axis by a motor 21. A polishing pad 22 made from synthetic resin or non-woven cloth having many pores is arranged on the first platen P1. A slurry arm 23 that supplies a polishing slurry and a conditioner 24 that conditions the polishing pad 22 are arranged on the polishing pad 22. The conditioner 24 is rotatably configured within a plane in parallel to the surface of the polishing pad 22 by a motor 25, and at the same time, to be movable up and down with regard to the polishing platen P1. The polishing pad 22 is conditioned by coming into contact with the polishing 22, for example, every time one or multiple wafers are polished.

Further, the head H1 is supported by the arm of the rotating head mechanism 4 via a motor 26, and is configured to rotate within a plane in parallel to the surface of the polishing pad 22. The wafer W, which is the object for polishing, is supported on the lower surface of the head H1 by an un-shown vacuum adsorption mechanism arranged in the head H1 while the surface to be polished faces downward. The head H1 is descended to the position where the wafer W comes into contact with the polishing pad 22. Also, the polishing platen P1 and the head H1 are rotated while the polishing slurry is supplied from the slurry arm 23 and then, the wafer W is polished.

Further, the cleaning section 3 is composed with multiple cleaning units that clean the wafers polished in the polishing section 2 in stages, as shown in FIG. 1. The cleaning section 3 of the present embodiment is configured such that an input station C0, a first cleaning unit C1 that cleans a wafer by scrubbing with a brush, a second cleaning unit C2 that rinses the wafer with purified water and a drying unit C3 that dries the wafer, in series. Further, the cleaning section 3 includes the wet robot (cleaning section conveyance unit) R3 to be movable along the input station C0, the first cleaning unit C1, the second cleaning unit C2 and the drying unit C3. The wet robot R3 conveys wafers between the cleaning units by moving within the space established at the upper side of the input station C0, the first cleaning unit C1, the second cleaning unit C2 and the drying unit C3. Furthermore, the cleaning section 3 shown in FIG. 1 is one example, and the cleaning section 3 may include another cleaning unit that cleans wafers using another cleaning method, such as ultrasonic cleaning or aerosol cleaning.

In addition, the substrate processing apparatus 10 includes an apparatus control unit 11 that controls the operation of each part of the apparatus. The apparatus control unit 11 includes a polishing controller 12 that controls the polishing operation of the polishing section 2, a cleaning controller 13 that controls the cleaning operation of the cleaning section 3, a conveyance controller 14 that controls the conveyance operation within the apparatus, and an abnormality determiner (abnormality detection unit) 15 to be described later. Furthermore, the polishing operation is an operation regarding the wafer polishing, and this indicates the rotation of the polishing platens P1 to P3, the up-and-down movement and the rotation of the heads H1 to H4, the supply of the polishing slurry from the slurry arm 23, and the conditioning by the conditioner 24. Further, the cleaning operation indicates an operation regarding the brush scrubbing cleaning processing by the first cleaning unit C1, the rinsing processing by the second cleaning unit C2 and the drying processing by the drying unit C3. In addition, the conveyance operation indicates the wafer conveyance by the dry robot R1, and the wet robots R2 and R3; the rotation of the rotating head mechanism 4; the wafer conveyance from the pre-polishing wafer reversal unit U1 to the load-unload unit 5; and the wafer conveyance from the load-unload unit 5 to the post-polishing wafer reversal unit U2. Further, the apparatus control unit 11 can be realized by, for example, an exclusive-use calculation circuit, or hardware equipped with a processor and memory, such as RAM or ROM, and software that is stored in the memory and operated on the processor.

Furthermore, the substrate processing apparatus 10 having the above configurations is surrounded by a shielding material so as not to allow entry of any light into the apparatus from the outside.

When wafers are polished and cleaned by the substrate processing apparatus 10, first, the FOUP where multiple wafers (for example, 25 pieces), which are objects for processing, are contained, is set to any load port (for example, the load port LP2). Once the FOUP is set, the dry robot R1 conveys the first wafer W1 from the FOUP based upon an instruction by the conveyance controller 14. Further, the dry robot R1 moves to the position facing to the wet robot R2 while the wafer W1 is retained. Next, the wet robot R2 receives the wafer W1 from the dry robot R1, and mounts the wafer W1 to the pre-polishing wafer reversal unit U1 in the polishing section 2 based upon an instruction by the conveyance controller 14. Furthermore, the wafer from the dry robot R1 to the wet robot R2 does not have to be directly passed, but it can be passed via a temporal reserve on reserve place for wafers.

Subsequently, after the wafer W1 is reversed by the pre-polishing wafer reversal unit U1 based upon an instruction by the conveyance controller 14, the wafer W1 is conveyed to the load-unload unit 5. At this time, any of the head H1 to H4 is in reserve at the upper side of the load-unload unit 5. Here, the head H1 is assumed to be in reserve. Further, when the wafer W1 on the pre-polishing wafer reversal unit U1 is conveyed to the load-unload unit 5, the conveyance from the FOUP reaching the pre-polishing wafer reversal unit U1 is conducted to a next wafer W2.

When the wafer W1 is mounted onto the load-unload unit 5, the head H1 descends based upon an instruction by the conveyance controller 14. At the same time, the wafer W1 is adsorbed onto the lower surface of the head H1, based upon an instruction by the conveyance controller 14. When the adsorption of the wafer W1 is complete, after the conveyance controller 14 raises the head H1, it rotates the rotating head mechanism 4 by 90 degrees around the center of axis. This rotation causes the movement of the head H1 to the upper side of the first polishing platen P1. At this time, the conveyance controller 14 notifies the polishing controller 12 that the wafer conveyance to the first polishing platen P1 is complete.

The head H1 that has reached the upper side of the first polishing platen P1 descends based upon an instruction by the polishing controller 12, and the surface to be polished in the wafer W1 makes contact with the polishing pad 22 (see FIG. 2) on the first polishing platen P1 by predetermined polishing pressure. Then, the polishing controller 12 rotates the first polishing platen P1 and the head H1 while the polishing slurry is supplied from the slurry arm 23 (see FIG. 2). This results in polishing the copper film on the surface of the wafer W1 partway. A polishing end point of the polishing is detected, for example, by a well-known technique, such as a polishing end point detecting mechanism using eddy current. When polishing processing by the first polishing platen P1 is complete, the polishing controller 12 instructs an un-shown ultrapure water supplying unit to supply the ultrapure water to the surface of the first polishing platen P1, and the polishing slurry on the surface of the wafer W1 is removed.

Further, in parallel to the polishing processing of the wafer W1 by the first polishing platen P1, the conveyance controller 14 has the pre-polishing wafer reversal unit U1 convey the wafer W2 to the load-unload unit 5. When the wafer W2 is mounted onto the load-unload unit 5, as similar to the above-mentioned operation, the head H2 descends and the wafer W2 is adsorbed onto the lower surface of the head H2. Further, when the wafer W2 on the pre-polishing wafer reversal unit U1 is conveyed to the load-unload unit 5, a next wafer W3 is conveyed to the pre-polishing wafer reversal unit U1.

When polishing by the first polishing platen P1 is competed, the polishing controller 12 notifies the conveyance controller 14 of the completion. If the adsorption of the wafer W2 to the head H2 is complete, after the head H1 and the head H2 ascend, the conveyance controller 14 rotates the rotating head mechanism 4 by 90 degrees around the axis of rotation, causing the movement of the head H1 to the upper side of the second polishing platen P2 and the movement of the head H2 to the upper side of the first polishing platen P1. At this time, the conveyance controller 14 notifies the polishing controller 12 that the wafer conveyance is complete.

The head H1 that has reached the upper side of the second polishing platen P2 descends based upon an instruction by the polishing controller 12, and the surface to be polished in the wafer W1 makes contact with the polishing pad 22 (see FIG. 2) on the second polishing platen P2 by predetermined polishing pressure. Then, the polishing controller 12 rotates the second polishing platen P2 and the head H1 while the polishing slurry is supplied from the slurry arm 23 (see FIG. 2). This results in the complete removal of the copper film on the surface of the wafer W1. Furthermore, a polishing end point of the polishing can be detected by a well-known technique where the head H2 is lifted, a laser is irradiated on the wafer surface, and the change of the reflection intensity is detected. When polishing processing by the second polishing platen P2 is complete, the polishing controller 12 instructs the not-shown ultrapure water supplying unit to supply the ultrapure water to the surface of the second polishing platen P2, and the polishing slurry is removed.

Further, in parallel to the polishing processing of the wafer W1 by the second polishing platen P2, the polishing processing of the wafer W2 is conducted by the first polishing platen P1 based upon an instruction by the polishing controller 12. Further, the conveyance controller 14 has the pre-polishing wafer reversal unit U1 convey the wafer W3 to the load-unload unit 5. When the wafer W3 is mounted onto the load-unload unit 5, similar to the aforementioned operation, the head H3 descends and the wafer W3 is adsorbed to the lower surface of the head H3. Further, the wafer W3 on the pre-polishing wafer reversal unit U1 is conveyed to the load-unload unit 5, a next wafer W4 is conveyed to the pre-polishing wafer reversal unit U1.

When polishing by the first polishing platen P1 and the second polishing platen P2 is complete, if the adsorption of the wafer W3 to the head H3 is complete, after the heads H1, H2 and H3 are ascended, the polishing controller 12 rotates the rotating head mechanism 4 by 90 degrees around the axis of rotation, resulting in the movement of the head H1 to the upper side of the third polishing platen P3, the movement of the head H2 to the upper side of the second polishing plate P2 and the movement of the head H3 to the upper side of the first polishing platen P1. At this time, the conveyance controller 14 notifies the polishing controller 12 that the wafer conveyance is complete.

The head H1 that has reached the upper side of the third polishing platen P3 descends based upon an instruction by the polishing controller 12, and the surface to be polished in the wafer W1 makes contact with the polishing pad 22 (see FIG. 2) on the third polishing platen P3 by predetermined polishing pressure. Then, the polishing controller 12 rotates the third polishing platen P3 and the head H1 while the polishing slurry is supplied from the slurry arm 23 (see FIG. 2). This results in the complete removal of the barrier metal and the adhesion layer on the surface of the wafer W1. In polishing, in order to completely remove the metal film on the surface of the wafer W1, over-polishing is conducted. A polishing end point of the polishing can be determined from a polishing time period calculated based upon a polishing rate data of an accumulated prior lot in the mass-production process. Alternatively, a technique where a laser is irradiated onto the wafer surface and the over-polishing is conducted for a predetermined time period according to a time when the change of reflection intensity is detected can be used. In this case, the predetermined time period may be calculated based upon the data of a polishing rate of the accumulated prior lot. When polishing processing by the third polishing platen P3 is complete, the polishing slurry is removed by supplying the ultra-pure water.

Further, in parallel to the polishing processing of the wafer W1 by the third polishing platen P3, the polishing processing of the wafer W2 is conducted by the second polishing platen P2 based upon an instruction by the polishing controller 12. Further, the polishing processing of the wafer W3 is conducted by the first polishing platen P1 based upon an instruction by the polishing controller 12. In addition, the wafer W4 on the pre-polishing wafer reversal unit U1 is conveyed to the load-unload unit 5 based upon an instruction by the conveyance controller 14. When the wafer W4 is mounted onto the load-unload unit 5, the head H4 descends and the wafer W4 is adsorbed to the lower surface of the head H4. Further, when the wafer W4 on the pre-polishing wafer reversal unit U1 is conveyed to the load-unload unit 5, a next W5 is conveyed to the pre-polishing wafer reversal unit U1.

When polishing by the first polishing plate P1, the second polishing platen P2 and the third polishing plate P3 is complete, if the adsorption of the wafer W4 to the head H4 is complete, after the conveyance controller 14 raises the heads H1, H2, H3 and H4, it rotates the rotating head mechanism 4 by 90 degrees around the center of axis of rotation. With this operation, the head H1 is moved to the upper side of the load-unload unit 5. Further, the head H2 is moved to the upper side of the third polishing platen P3; the head H3 is moved to the upper side of the second polishing platen P2; and the head H4 is moved to the upper side of the first polishing platen P1.

At this time, the heads H2, H3 and H4 that have reached the upper sides of the polishing platens P1, P2 and P3 respectively descend based upon an instruction by the polishing controller 12, and the polishing processing is conducted on the wafers W2, W3 and W4. Further, the head H1 that has reached the upper side of the load-unload unit 5 descends based upon an instruction by the conveyance controller 14. At the same time, the adsorption of the wafer W1 is cancelled on the load-unload unit 5. The head H1 that has canceled the adsorption of the wafer W1 is in reserve in the elevated state. The wafer W1 is conveyed to the post-polishing wafer reversal unit U2 while the surface to be polished faces downward based upon the instruction by the conveyance controller 14, and the two sides are reversed by the post-polishing wafer reversal unit U2. Further, when the wafer W1 is conveyed to the post-polishing wafer reversal unit U2, the conveyance controller 14 has the pre-polishing wafer reversal unit U1 convey the wafer W5 to the load-unload unit 5. When the wafer W5 is mounted onto the load-unload unit 5, the head H1 descends and the wafer W5 is adsorbed onto the lower surface of the head H1.

The wafer W1 on the post-polishing wafer reversal unit U2 is conveyed by the wet robot R2 based upon an instruction by the conveyance controller 14, and is conveyed into the input station C0 in the cleaning section 3. Furthermore, a next wafer W6 is conveyed to the pre-polishing wafer reversal unit U1 after the wet robot R2 conveys the wafer W1 into the input station C0.

Subsequently, the wafer W1 is conveyed to the first cleaning unit C1 from the input station C0 by the wet robot R3 of the cleaning section 3 based upon an instruction by the conveyance controller 14. When the conveyance is complete, the conveyance controller 14 notifies the cleaning controller 13 of the completion. At this time, the cleaning controller 13 instructs the first cleaning unit C1 to start the brush scrub cleaning of the wafer W1. Furthermore, the ultrapure water supplying unit (un-shown) that discharges the ultrapure water toward the wafers is arranged on the conveyance route from the load-unload unit 5 to the first cleaning unit C1, and it prevents drying of the wafer surface after the polishing is completed.

When brush scrub cleaning is complete, the cleaning controller 13 notifies the conveyance controller 14 of the completion. The notified conveyance controller 14 has the wet robot R3 convey the wafer W1 from the first cleaning unit C1 to the second cleaning unit C2. Further, when the conveyance is complete, the conveyance controller 14 notifies the cleaning controller 13 of the completion.

At this time, the cleaning controller 13 has the second cleaning unit C2 start the rinsing processing of the wafer W1 using the ultrapure water. When the rinsing processing is complete, the cleaning controller 13 notifies the conveyance controller 14 of the completion. The notified conveyance controller 14 has the wet robot R3 convey the wafer W1 from the second cleaning unit C2 to the drying unit C3. When the conveyance is complete, the conveyance controller 14 notifies the cleaning controller 13 of the completion.

At this time, the cleaning controller 13 has the drying unit C3 start the drying processing to the wafer W1. When the drying processing is complete, the cleaning controller 13 notifies the conveyance controller of the completion. The notified conveyance controller 14 has the dry robot R1 convey the wafer W1 from the drying unit C3. The wafer W1 is stored in the original FOUP, or another FOUP, which is set to another load port that is different from the one for the original FOUP, for storing polished wafers. As described above, a series of the polishing processing and the cleaning processing are conducted to multiple wafers in parallel, and the polishing processing and the cleaning processing are conducted to all wafers in the FOUP.

The substrate processing apparatus 10 always maintains the time period from the completion of the final stage polishing (Here, the polishing by the third polishing platen P3) until the start of the cleaning by the cleaning unit C1 at a certain time period by adopting the technique mentioned below in the series of the processing. This prevents the long-term attachment of the surface of wafer where the final stage polishing has been completed to the ultrapure water.

First, in the polishing section 2, a polishing condition for the polishing platens P1 to P3 is set so as to control the final stage polishing (Here, the third polishing platen P3) to be rate-determining step, respectively. In other words, the polishing conditions for the polishing platens P1 to P3 where a polishing processing time for the final stage polishing becomes the longest are set to the polishing controller 12. As described above, in the polishing section 2, the polishing processing by the polishing platens P1 to P3 and the conveyance-out processing of the polished wafer and the conveyance-in processing of the next wafer to be polished in the load-unload unit 5 are conducted in parallel. Therefore, when the final stage polishing is complete, if other processing is all completed, it becomes possible to promptly convey the wafer where the final stage polishing has been completed without reserve.

In order to control a processing time of the polishing in the polishing section 2 based upon a processing time of the polishing processing by the third polishing platen P3, in the present embodiment, a polishing time period $T_{P1}$ by the first polishing platen P1, a polishing time period $T_{P2}$ by the second polishing platen P2, a polishing time period $T_{P3}$ by the third polishing plate P3, a wafer unloading time period $T_{UL}$ by the load-unload unit 5, and a wafer loading time period $T_L$ by the load-unload unit 5 are set to the conditions that satisfy the formulae (1) to (3) mentioned below. Here, the wafer unloading time period $T_{UL}$ is a time period required for the wafer conveyance from the load-unload unit 5 to the post-polishing wafer reversal unit U2. Further, the wafer loading time period $T_L$ is a time period required for the wafer conveyance from the pre-polishing wafer reversal unit U1 to the load-unload unit 5.

$$T_{P1} = T_{P3} \tag{1}$$

$$T_{P2} = T_{P3} \tag{2}$$

$$T_{UL} + T_L = T_{P3} \tag{3}$$

Furthermore, the conveyance time period of a wafer from any of the load ports LP1 to LP4 to the pre-polishing wafer reversal unit U1 is sufficiently small compared to the polishing time period by the polishing platens P1 to P3, respectively, so it does not affect the processing in the polishing section 2.

The polishing conditions that satisfy the formulae (1) to (3) can be determined based upon the Preston formula shown as the formula (4) mentioned below. In other words, the polishing amount M satisfies the formula (4) expressed with polishing pressure p, polishing relative velocity v, polishing time t and Preston coefficient η.

$$M = \eta \cdot p \cdot v \cdot t \tag{4}$$

Here, the polishing relative velocity v is a travel distance per unit time on the locus drawn by the center of a wafer on the polishing pad over time.

Therefore, the appropriate setting of the polishing pressure p and the polishing relative velocity v enables the change of the polishing time t in order to obtain the predetermined polishing amount M.

In the present embodiment, in order to satisfy the formulae (1) to (3), the polishing conditions for the third polishing platen P3 are set with 1.5 psi (10.3 KPa) or less of polishing pressure and 80 rpm or greater of the number of rotations for the polishing platen P3. At this time, the polishing conditions for the first polishing platen P1 are set with 0.5 to 3 psi (3.4 to 20.7 Kpa) of polishing pressure, and 50 to 150 rpm of the number of rotations for the first polishing platen P1. Further, the polishing conditions for the second polishing platen P2 are set with 0.5 to 3 psi (3.4 to 20.7 Kpa) of polishing pressure, and 50 to 150 rpm of the number of rotations for the second polishing platen P2. Furthermore, a TaN film with 3 to 20 nm of film thickness, a Ta film with 10 to 40 nm of film thickness, and a Cu film with 300 to 1,200 nm of film thickness are deposited on the wafer to be polished in sequence. Further, the polishing amount by the first polishing platen P1 is 100 to 1,100 nm; the polishing amount by the second polishing platen P2 is 100 to 300 nm; and the polishing amount by the third polishing platen P3 is 30 to 100 nm.

As described above, if the formulae (1) to (3) are satisfied, the final stage of polishing by the polishing platen can be a rate-determining step in the polishing section 2.

In the meantime, a cleaning condition where the completely polished wafer will never be in reserve at the input station C0 is set for the cleaning section 3. In other words, the processing time periods for the cleaning units C1 to C3 where the processing in the cleaning section 3 does not affect the conveyance state of the wet robot R3 is set to the cleaning controller 13. With this design, the cleaning of wafer conveyed from the polishing section 2 can promptly be started without putting the wafer in reserve.

In the cleaning section 3 where one wet robot R3 passes wafer to each of the cleaning units C1 to C3 arranged in series, in order to prevent the accumulation of the wafer, a brush scrubbing time period $T_{C1}$, a rinsing time period $T_{C2}$ and a drying time period $T_{C3}$ may satisfy formulae (5) and (6) mentioned below. Furthermore, the time period required for the wafer conveyance between the cleaning units is all set at a constant time a.

$$T_{C2}=T_{C3}+a \quad (5)$$

$$T_{C1}=T_{C2}+a=T_{C3}+2a \quad (6)$$

In other words, as shown with the formula (5), if the rinsing time period $T_{C2}$ is set as a sum of the drying time period $T_{C3}$ and the conveyance time period a, when the rinsing processing is completed by the second cleaning unit C2, the wafer, which has been dried just before, is conveyed from the drying unit C3. Further, as shown in the formula (6), if the brush scrubbing cleaning time period $T_{C1}$ is set as a sum of the rinsing time period $T_{C2}$ and the conveyance time period a, when the brush scrubbing cleaning processing is completed by the first cleaning unit C1, the wafer, which has been rinsed just before, is conveyed from the second cleaning unit C2. Therefore, wafer reserve within the cleaning section 3 can be prevented by adopting the cleaning conditions that satisfy the formulae (5) and (6). Furthermore, in this case, the first cleaning unit C1 becomes a rate-controlling step of processing in the cleaning section 3.

In addition, after the polishing by the third polishing platen P3 is complete, in order to start the cleaning of the completely polished wafer without causing reserve, it is necessary to add the limitation expressed with formulae (7) and (8) between the rate-controlling steps of the polishing section 2 and the cleaning section 3. Furthermore, Here, a time period required for the wafer conveyance from the polishing section 2 to the input station C0 in the cleaning section 3, i.e., a time period required for the conveyance (conveyance by the intermediate conveyance unit) by the load-unload unit 5, the post-polishing wafer reversal unit U2 and the wet robot R2 is regarded as a time b.

$$T_{P3}+b>T_{C1} \quad (7)$$

$$(T_{P3}+b)/T_{C1}=a(a \text{ is an irrational number}) \quad (8)$$

In the case of satisfying the formula (7), when the wafer where polishing has been completed by the polishing platen for the final stage polishing is conveyed to the input station C0 in the cleaning section 3, the wafer cleaning, which has been cleaned by the first cleaning unit C1 just before, is completed. However, if the time period $T_{P3}+b$ is the same as the cleaning time $T_{C1}$ by the first cleaning unit C1, a wafer conveyance timing from the input station C0 to the first cleaning unit C1 happens to coincide with a wafer conveyance timing from the first cleaning unit C1 to the second cleaning unit C2. In this case, when the wafer where the final stage polishing has been completed by the polishing platen P3 is conveyed to the input station C0 in the cleaning section 3, the conveyance reserve occurs. Further, when a ratio of the period time $T_{P3}+b$ to the time period $T_{C1}$ also becomes a rational number (for example, 1.2 or 1.5), if multiple wafers is consecutively processed, it is possible that the conveyance timings may be coincided with each other. Therefore, it is necessary to satisfy the formula (8) in order to convey the wafer, which has already been conveyed from the polishing section 2 to the input station C0, to the first cleaning unit C1 without being held in reserve.

As described above, if the conditions that satisfy the formulae (1) to (3) and the formulae (5) to (8) are set to the polishing controller 12 and the cleaning controller 13 and they are periodically operated, wafers where the final stage polishing has been completed can be conveyed into the cleaning unit for the first cleaning processing without being held in reserve. In other words, the time period to attach the surface of the completely polished wafer to the ultrapure water can be a bare essential time period b. As a result, corrosion of the copper wiring can be restrained.

Figure 3:
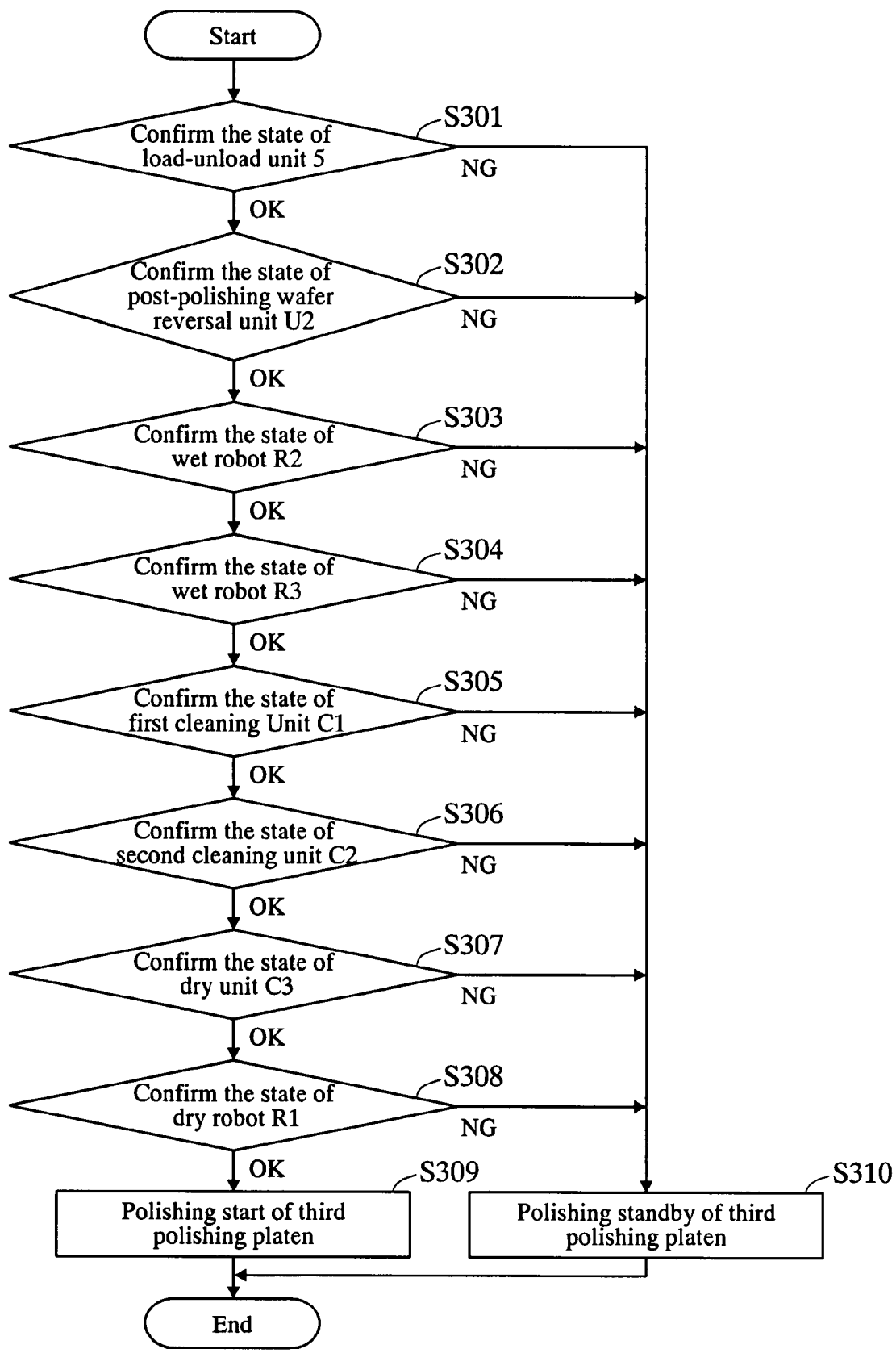
FIG. 3 is a flowchart showing abnormality determination processing in the first embodiment relating to the present invention.

Further, the situation where the substrate processing apparatus 10 is operated without any trouble was described. However, for example, if trouble occurs, for example, a wafer cannot be adsorbed in the load-unload unit 5, it becomes impossible to conduct the operations mentioned above. Then, in the present embodiment, when polishing is started at the third polishing platen P3, the abnormality determiner 15 in the apparatus control unit 11 confirms whether or not each part of the apparatus after the third polishing platen P3 is normally operated. FIG. 3 is a flowchart showing the confirmation processing. Furthermore, in the present embodiment, operation start signals and operation end signals to each part of the apparatus positioned on the wafer conveyance route after the third polishing platen P3 are entered into the abnormality determiner 15 from the polishing controller 12, the conveyance controller 14 and the cleaning controller 13. Further, when the operation start signal or the operation end signal is entered, the abnormality determiner 15 acquires the entry time from a timer unit 30 and stores the time to a memory unit 16 composed of a storage device, such as HDD (hard disk drive). In addition, output signals from various sensors arranged in each part of the apparatus positioned on the wafer conveyance route at the downstream side from to the third polishing platen P3 are also entered into the abnormality determiner 15, so and it is configured that an abnormality of each part of the apparatus can be detected.

As described above, when a wafer is conveyed onto the third polishing platen P3, the conveyance controller 14 notifies the abnormality determiner 15 of the conveyance. The notified abnormality determiner 15, first, confirms the state of the load-unload unit 5 (Step S301). The state herein can be confirmed, for example, according to a processing start time and a processing end time of the load-unload unit 5, a processing time period calculated from a difference of these times, and the determination about whether or not there is any abnormality in the sensor output arranged in the load-unload unit 5. Furthermore, the processing of the load-unload unit 5 is, for example, processing from mounting of a previously polished wafer to carrying-out of the wafer.

When no abnormality is confirmed in the state of the load-unload unit 5, the abnormality determiner 15 confirms a state of the post-polishing wafer reversal unit U2 (Step S301 OK, Step S302). The state confirmation here is also similar to the state confirmation of the load-unload unit 5.

When no abnormality is confirmed in the state of the post-polishing wafer reversal unit U2, the abnormality determiner 15 confirms a state of the wet robot R2 (Step S302 OK, Step S303). The state confirmation here is also similar to the state confirmation of the load-unload unit 5.

Hereafter, similarly, when no abnormality is confirmed in the state of the wet robot R2, the abnormality determiner 15 confirms a state of the wet robot R3 (Step S303 OK, Step S304). When no abnormality is confirmed in the state of the wet robot R3, the abnormality determiner 15 confirms a state of the first cleaning unit C1 (Step S304 OK, Step S305). When no abnormality is confirmed in the state of the first cleaning unit C1, the abnormality determiner 15 confirms a state of the second cleaning unit C2 (Step S305 OK, Step S306). When no abnormality is confirmed in the state of the second cleaning unit C2, the abnormality determiner 15 confirms a state of the drying unit C3 (Step S306 OK, Step S307). When no abnormality is confirmed in the state of the drying unit C3, the abnormality determiner 15 confirms a state of the dry robot R1 (Step S307 OK, Step S308).

When no abnormality is confirmed in the state of the dry robot R1, the abnormality determiner 15 notifies the polishing controller 12 of no abnormality. The notified polishing controller 12 starts the polishing processing at the third polishing platen P3 (Step S308 OK, Step S309).

In the meantime, in each of the determination steps S301 to S308, after the polishing processing is started by the third polishing platen P3, if any abnormality, which makes it difficult to be restored by the time of the completion of the polishing processing, has occurred to the confirmed object, the abnormality determiner 15 notifies the polishing controller 12 of the abnormality. The notified polishing controller 12 does not start the polishing processing by the third polishing platen P3, but put the wafer in reserve in the state before the start of the polishing processing (Steps S301 NG to S308 NG, Step S310). Further, at this time, the abnormality determiner 15 instructs an alarm unit 20 to issue an alert. The alarm unit 20 issues the alert using any communicable form to operators, such as sound, light or alarm display, and informs the operators of stoppage of the polishing processing.

Furthermore, the flowchart for the abnormality determination processing shown in FIG. 3 is one example, and the order to confirm the states of objects to be confirmed can be optionally changed. Further, for objects where an abnormality hardly occurs or where states of the objects to be confirmed can be confirmed by confirming states of other objects to be confirmed, the state confirmation can be appropriately omitted. For example, when no abnormality is confirmed in the state of the load-unload unit 5 and the wet robot R2, it can be considered that the post-polishing wafer reversal unit U2 is normally operated.

As described above, when polishing by the polishing platen for the final stage polishing is started, the substrate processing apparatus of the present embodiment confirms whether or not there is any abnormality in each part on the wafer conveyance route after the polishing platen for the final stage polishing. Then, when an abnormality is confirmed, the polishing processing by the third polishing platen P3 is not started but the wafer is put in reserve. Therefore, even though any abnormality has occurred to the apparatus, the situation where the ultrapure water is attached to the surface of the wafer where the final stage polishing has been completed for a long time will not occur. As a result, corrosion of the copper wiring is prevented.

According to the present embodiment, a wafer where the final stage polishing has been completed can be conveyed in a bare essential time period, and the attachment time period of the ultrapure water to the wafer surface can be the bare essential time period. As a result, corrosion of the copper wiring can be restrained. Further, in the present embodiment, only when no abnormality is confirmed to each part positioned on the wafer conveyance route after the polishing platen for the final stage polishing, the final stage polishing is started. Consequently, even if any abnormality occurs to the substrate processing apparatus, corrosion of the copper wiring can be assuredly prevented.

Second Embodiment

Figure 11:
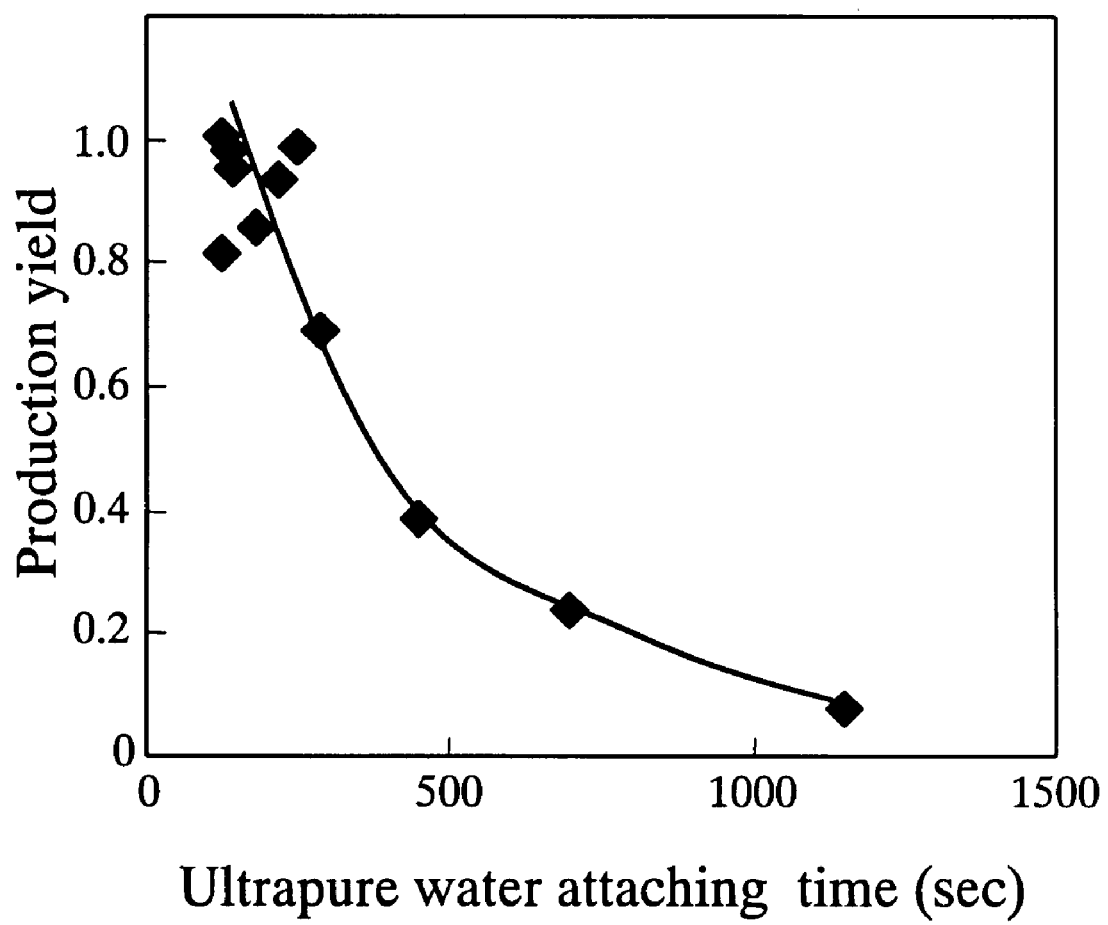
FIG. 11 is a graph showing the relationship between the elapsed time after the final stage of polishing is completed and the production yield.

In the first embodiment, because a wafer is conveyed from the polishing section 2 to the cleaning section 3 without any conveyance reserve, the wafer conveyance time period is a bare essential time period, and corrosion of the copper wiring is prevented. However, as shown in FIG. 11, if it is configured that the cleaning processing of a wafer where the final stage polishing has been completed can be started within a predetermined time period (for example, 300 seconds), wiring corrosion caused by attachment of ultrapure water can be restrained. Then, in the present embodiment, a substrate processing apparatus where the conveyance time period from the polishing section 2 to the cleaning section 3 can be kept within a predetermined time is described.

Figure 4:
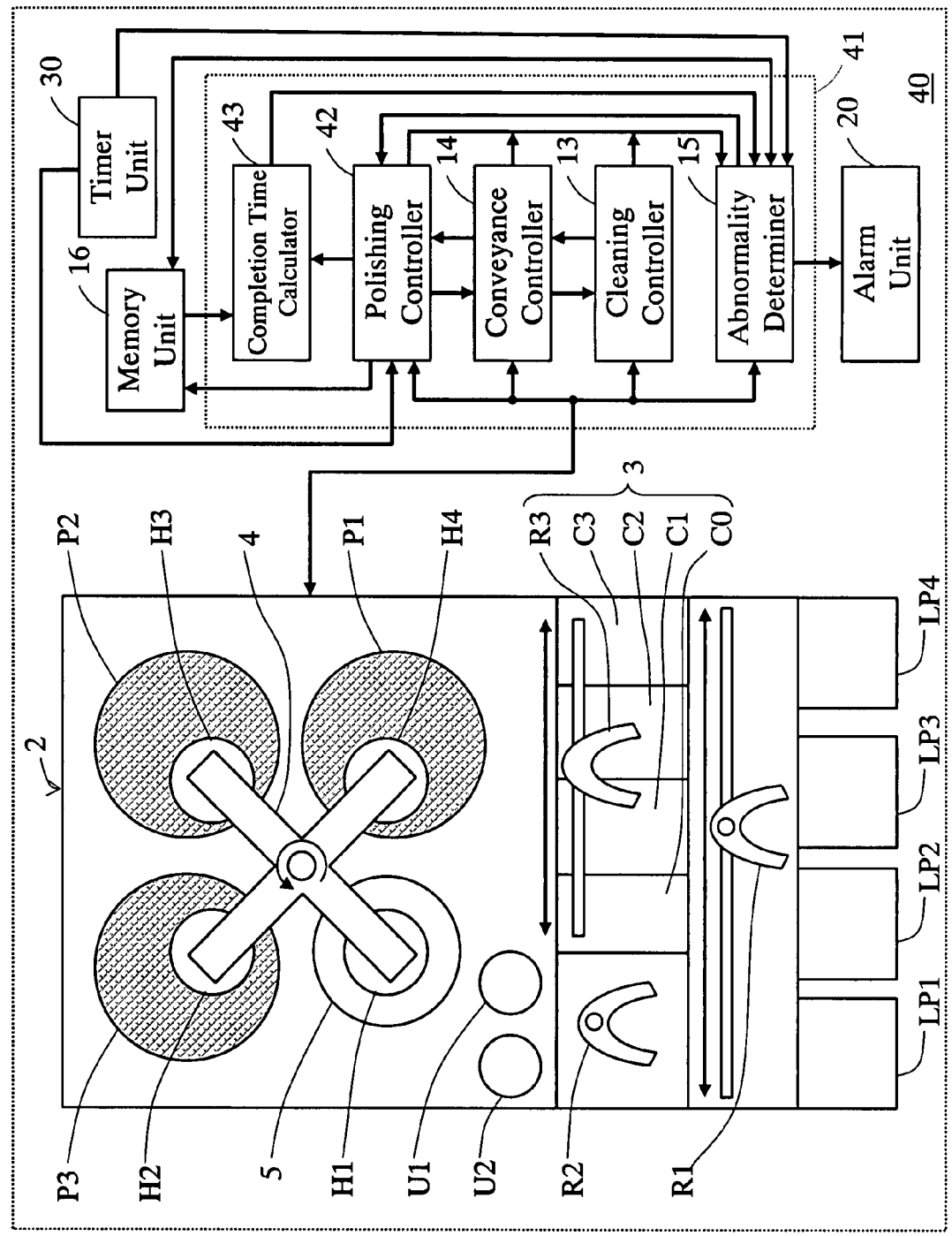
FIG. 4 is a schematic block diagram showing a substrate processing apparatus in the second embodiment relating to the present invention.

FIG. 4 is a schematic block diagram showing the substrate processing apparatus in the second embodiment relating to the present invention. As shown in FIG. 4, a substrate processing apparatus 40 of the present invention polishes wafers using three platens in stages, similarly to the substrate processing apparatus 10 described in the first embodiment. The substrate processing apparatus 40 has a different configuration in the apparatus control unit compared to the substrate processing apparatus 10 described in the first embodiment. The other configurations are the same as those of the substrate processing apparatus 10 in the first embodiment. Furthermore, in FIG. 4, the same elements shown in FIG. 1 are marked with the same symbols, and any detailed descriptions about them are omitted hereafter.

As shown in FIG. 4, an apparatus control unit 41 in the substrate processing apparatus 40 includes a polishing controller 42 that controls the polishing operation of the polishing section 2. Further, when polishing by each of the polishing platens P1 to P3 is started and then completed, the polishing controller 42 acquires a start time and completion time from the timer unit 30, respectively, and the time is stored in the memory unit 16 composed with the storage device, such as HDD. Further, the apparatus control unit 41 includes a completion time calculator 43 that expects an expected polishing completion time for the polishing platens P1 to P3 when polishing by the polishing platens P1 to P3 is started, respectively. The completion time calculator 43 calculates a polishing time period of wafers from the polishing start time and the polishing end time of the previously processed wafers by the polishing platens P1 to P3 stored in the memory unit 16, respectively, and acquires the expected polishing completion time of wafers, which are currently polished by the polishing platens P1 to P3, respectively.

When polishing is conducted in the substrate processing apparatus 40 having the configurations mentioned above, as similar to the first embodiment, first, the wafer W1 is conveyed from the FOUP, based upon an instruction by the conveyance controller 14. The wafer W1, for example, is conveyed to the upper side of the first polishing platen P1 while the wafer W1 is adsorbed to the head H1. The head H1 descends based upon an instruction by the polishing controller 42, and a surface to be polished in the wafer W1 makes contact with the polishing pad on the first polishing platen P1 by predetermined polishing pressure. Then, the polishing controller 42 rotates the first polishing platen P1 and the head H1 while the polishing slurry is supplied onto the polishing pad. At this time, the polishing controller 42 acquires a time from the timer unit 30. And the polishing controller 42 stores the time to the memory unit 16 as the polishing start time of the first polishing platen P1.

In the polishing process, the polishing controller 42 that has detected a polishing end point by the end point detecting method, which was described in the first embodiment, instructs the un-shown ultrapure water supplying unit to supply the ultrapure water to the surface of the first polishing platen P1, and the polishing slurry on the surface of the wafer W1 is removed. At this time, the polishing controller 42 acquires a time from the timer unit 30 and stores the time to the memory unit 16 as the polishing completion time of the first polishing platen P1. Further, the polishing controller 42 notifies the conveyance controller 14 that polishing by the first polishing platen P1 is complete.

If the adsorption of the wafer W2 to the head H2 is complete, the notified conveyance controller 14 raises the heads H1 and H2 and moves the head H1 to the upper side of the second polishing platen P2, and at the same time, moves the head H2 to the upper side of the first polishing platen P1. When the movement is complete, the polishing controller 42 lowers the head H1, and a surface to be polished in the wafer W1 makes contact with the polishing pad on the second polishing platen P2 by predetermined polishing pressure. In parallel to this, the head H2 is descended and the surface to be polished in the wafer W2 makes contact with the polishing pad on the first polishing platen P1 by predetermined polishing pressure. In this situation, the polishing controller 42 supplies the polishing slurry onto the polishing pads, and rotates the first polishing platen P1, the head H1, the second polishing platen P2 and the head H2. At this time, the polishing controller 42 acquires a time from the timer unit 30, and stores a polishing start time of the second polishing platen P2 and a polishing start time of the first polishing platen P1 to the memory unit 16.

The polishing controller 42 that has detected the polishing end point by the second polishing platen P2 using the end point detecting method, which was described in the first embodiment, during the polishing process instructs to supply the ultrapure water to the surface of the polishing platen P2, and the polishing slurry is removed from the surface of the wafer W1. At this time, the polishing controller 42 stores the time acquired from the timer unit 30 to the memory unit 16 as a polishing completion time of the second polishing platen P2. Further, when polishing the end point of the wafer W2 by the first polishing platen P1 has already been detected at this time, the polishing controller 42 notifies the conveyance controller 14 that the polishing by the polishing platens P1 and P2 is completed. If the polishing end point by the first polishing platen P1 has not been detected yet, the polishing controller 42 will be held in reserve until the polishing end point by the first polishing platen P1 is detected, and when polishing end point is detected, the polishing controller 42 notifies the conveyance controller 14 that the polishing by the polishing platens P1 and P2 is completed. Furthermore, the polishing controller 42 also stores the polishing completion time by the first polishing platen P1 to the memory unit 16.

If the adsorption of the wafer W3 to the head H3 is complete, the notified conveyance controller 14 raises the heads H1 to H3, and moves the head H1 to the upper side of the third polishing platen P3. At this time, the head H2 is moved to the upper side of the second polishing platen P2, and the head H3 is moved to the upper side of the first polishing platen P1. When the movement is complete, the polishing controller 42 lowers the heads H1 to H3, and the surfaces to be polished in the wafers make contact with the corresponding polishing pad by predetermined polishing pressure, respectively. The polishing controller 42 supplies the polishing slurry onto the polishing pads in this situation, and rotates the first polishing platen P1, the head H1, the second polishing platen P2, the head H2, the third polishing platen P3 and the head H3. At this time, the polishing controller 42 acquires a time from the timer unit 30, and stores a polishing start time of the third polishing platen P3, a polishing start time of the second polishing platen P2 and a polishing start time of the first polishing platen P1 to the memory unit 16.

At this time, the completion time calculator 43, for example, reads a polishing start time and a polishing completion time of wafers, which were polished just before by the first and second polishing platens P1 and P2, and which are stored in the memory unit 16. Further, a polishing time period for polishing conducted just before is calculated by calculating a difference between the polishing completion time and the polishing start time, respectively. Further, the polishing start time for ongoing polishing stored in the memory unit 16 is read, and the calculated polishing time period is added and an expected polishing completion time by the first and second polishing platen P1 and P2 is obtained, respectively. Further, the completion time calculator 43 reads a polishing start time and a polishing end time, which are stored in the memory unit 16, and which are for the previously polished same type of wafer, for the third polishing platen P3. Then, a polishing time period is calculated by calculating a difference between the both times. Further, the polishing start time, which is stored in the memory unit 16, and which is for the currently ongoing polishing, is read, and an expected polishing completion time for the third polishing platen P3 is obtained by adding the calculated polishing time period. The expected polishing completion time for the polishing platen P1, P2 and P3 obtained as described above is transmitted to the abnormality determiner 15, respectively.

Figure 5:
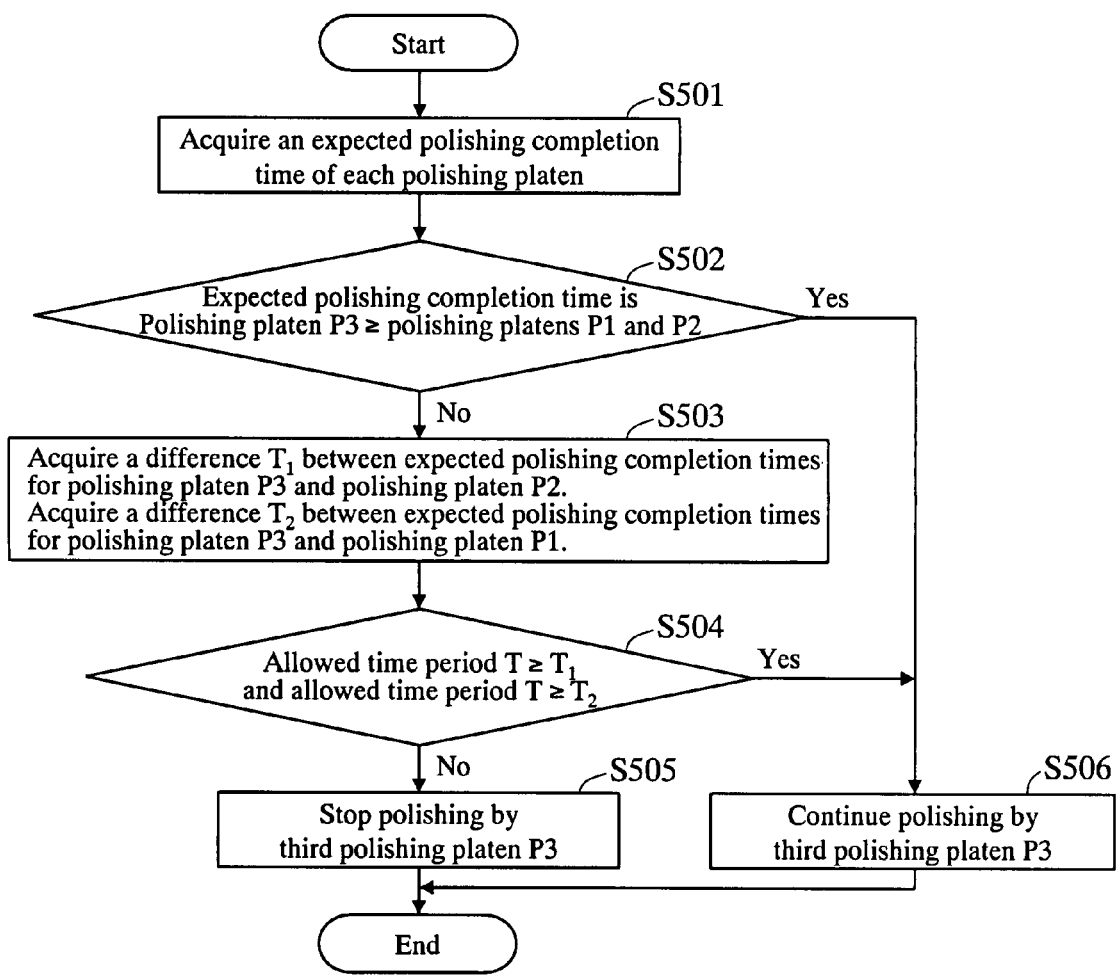
FIG. 5 is a flowchart showing abnormality determination processing in the second embodiment relating to the present invention.

FIG. 5 is a flowchart showing the processing to be executed by the abnormality determiner 15. As shown in FIG. 5, the abnormality determiner 15 compares and determines which one comes first between the expected polishing completion time for the third polishing platen P3 and the expected polishing completion time for the first or second polishing platens P1 or P2, respectively, based upon the acquired expected polishing completion time for the polishing platens P1 to P3 (Step S501, Step S502). If the expected polishing completion time for the third polishing platen P3 comes after the expected polishing completion time for the first and second polishing platens P1 and P2, respectively, when polishing by the third polishing platen P3 is complete, the polishing by the first and second polishing platens P1 and P2 should be completed. In other words, the completely polished wafer can be immediately conveyed. In this case, the abnormality determiner 15 does nothing, and the polishing that has already been started by the polishing platens P1 to P3 is continued, respectively (Step 502 Yes, Step S506).

In the meantime, if the expected polishing completion time for the third polishing platen P3 comes before the expected polishing completion time by the first and second polishing platen P1 and P2, respectively, when polishing by the third polishing platen P3 is complete, the polishing by the first and second polishing platens P1 and P2 is not completed yet, respectively. In other words, the wafer where the polishing has been completed by the third polishing platen P3 will be exposed to the ultrapure water on the third polishing platen until the polishing by the first and second polishing platens P1 and P2 is completed.

In this case, the abnormality determiner 15 acquires a time $T_1$ where the expected polishing completion time for the third polishing platen P3 is subtracted from the expected polishing completion time for the second polishing platen P2. Similarly, the abnormality determiner 15 acquires a time $T_2$ where the expected polishing completion time for the third polishing platen P3 is subtracted from the expected polishing completion time for the first polishing platen P1 (Step S502 No, Step S503). Then, the abnormality determiner 15 compares a predetermined allowed time period T and the differences $T_1$, $T_2$, respectively, and determines which one is greater (Step S504). Here, the allowed time period T is the upper limit of an allowed time period where the completely polished wafer can be exposed to the ultrapure water on the third polishing platen P3. The allowed time period T is determined, for example, based upon the ultrapure water attachment time period dependency of the copper wiring corrosion, as shown in FIG. 11. In other words, a time period where the time period after the completion of the final stage polishing by polishing section 2 until the start of the first cleaning processing by the cleaning section 3 is subtracted from the time period allowing the attachment to the ultrapure water is considered as the allowed time period T. Furthermore, a time period after the completion of the final stage polishing by the polishing section 2 until the start of the first cleaning processing by the cleaning section 3 is a constant time period, which is determined by depending upon the structure of the substrate processing apparatus. For example, if the ultrapure water attachment allowed time period is 5 minutes, the predetermined time period T is a time period where a time period after the completion of the final stage polishing until the start of the first cleaning processing is subtracted from 5 minutes. Further, the allowed time period T varies according to the pitch and/or density of the copper wiring, so it is set according to the product type of a semiconductor device formed on a wafer, which is an object to be polished.

When the allowed time period T is greater than both the difference $T_1$ and the difference $T_2$, the conveyance of the completely polished wafer is started within the allowed time period T. In this case, the abnormality determiner 15 does nothing, and the polishing that has already been started by the polishing platens P1 to P3 is continued (Step S540 Yes, Step S506), respectively. In the meantime, when at least either of the difference $T_1$ and the difference $T_2$ is greater than the allowed time period T, the conveyance of the completely polished wafer is not started within the allowed time period T. In other words, even if the polishing that has already been started by the polishing plates P1 to P3 is continued, respectively, the corrosion caused by the attachment of the ultrapure water onto the wafer surface for a long time shall occur to the copper wiring. In this case, the abnormality detector 15 stops the polishing that has already been started by the polishing platens P1 to P3 (Step S504 No, Step S505).

Since this stoppage is determined immediately after the polishing is started, the polishing can be stopped immediately after the start of the polishing by the polishing platens P1 to P3, respectively. Therefore, the polishing can be stopped in the situation where metal films (Here, the barrier metal and the adhesion layer) to electrically connect to each copper wiring remain on the wafer surface on the third polishing platen P3. Consequently, when copper wiring is formed on the wafer surface, which is electrically disconnected due to the polishing, the ultrapure water will never be attached to the wafer surface. As a result, corrosion of the copper wiring is prevented.

Furthermore, when at least either the difference $T_1$ or the difference $T_2$ is greater than the allowed time period T, the abnormality determiner 15 instructs the alarm unit 20 to issue an alert. The alarm unit 20 issues the alert, such as sound, light or alarm display, in any communicable method to operators, and informs the operators that the polishing has been stopped.

In the meantime, when polishing of the wafer W1 by the third polishing platen P3 is continued without stoppage, the polishing controller 42 that has detected the polishing end point for the third polishing platen P3 using the end point detecting method, which was described in the first embodiment, instructs the un-shown ultrapure water supplying unit to supply the ultrapure water onto the surface of the third polishing platen P3, and the polishing slurry on the surface of the wafer W1 is removed. At this time, the polishing controller 42 acquires a polishing completion time for the third polishing platen P3 and stores the time in the memory unit 16. Then, for the next wafer W2, the polishing completion time for the third polishing platen P3 can be expected based upon the polishing start time and the polishing end time for the wafer W1. Furthermore, as described above, when polishing by the polishing platens P1 to P3 is continued, respectively, the time period to attach the ultrapure water onto the wafer surface with the final stage polishing completed will be within the allowed range. Therefore, the corrosion of the copper wiring caused by the long-term attachment of the ultrapure water can be restrained.

Furthermore, the wafer conveyance after the polishing by the third polishing platen P3 has been completed is as described in the first embodiment, so any description herein will be omitted.

The substrate processing apparatus 40 has a function to confirm whether or not the wafer conveyance to the cleaning section 3 after the completion of the final stage polishing is completed within a certain period of time, which is a premise on the occasion of setting the allowed time period T. In other words, as similar to the first embodiment, the operation start signals and the operation end signals to each part of the apparatus positioned on the wafer conveyance route after the third polishing platen P3 are entered into the abnormality determiner 15 from the polishing controller 42, the conveyance controller 14 and the cleaning controller 13. When the operation start signal or the operation end signal is entered, the abnormality determiner 15 acquires the entry time from the timer unit 30 and stores the time to the memory unit 16. Then, when the wafer conveyance is not completed within the time period, which is a premise of the allowed time period T, the abnormality determiner 15 stops the polishing processing by the third polishing platen P3. At the same time, it instructs the alarm unit 20 to issue an alert. With this operation, continuous occurrence of the state where the ultrapure water is attached to the surface of the wafer where the final stage polishing has been completed, caused by the conveyance abnormality, can be prevented.

Furthermore, it may be configured that output signals from various sensors arranged in each part of the apparatus positioned on the wafer conveyance route at the downstream side from the third polishing platen P3 are entered into the abnormality determiner 15, and it may also be configured that the polishing is stopped when an abnormality operation of each part of the apparatus is detected.

As described above, according to the present embodiment, the time period for the ultrapure water to attach onto the surface of the wafer where the final stage polishing has been completed can be a predetermined time period or shorter. As a result, the corrosion of the copper wiring can be restrained. Further, in the present embodiment, if the wafer situated after the polishing platen for the final stage polishing is not normally conveyed, the polishing is stopped. Consequently, even if any abnormality occurs to the substrate processing apparatus, continuous corrosion of the copper wiring can be prevented.

Third Embodiment

In the second embodiment, it is configured that an expected polishing completion time by polishing plane for the final stage polishing and expected polishing completion times by the other polishing platens do not satisfy a pre-set allowed range, respectively, the polishing is stopped. However, when they do not satisfy the pre-set allowed range, another configuration where an expected polishing completion time is adjusted can also be adopted. Then, in the present embodiment, a configuration where polishing conditions for the polishing platens may be changed according to an expected polishing completion time for the polishing platens, respectively, is described.

Figure 6:
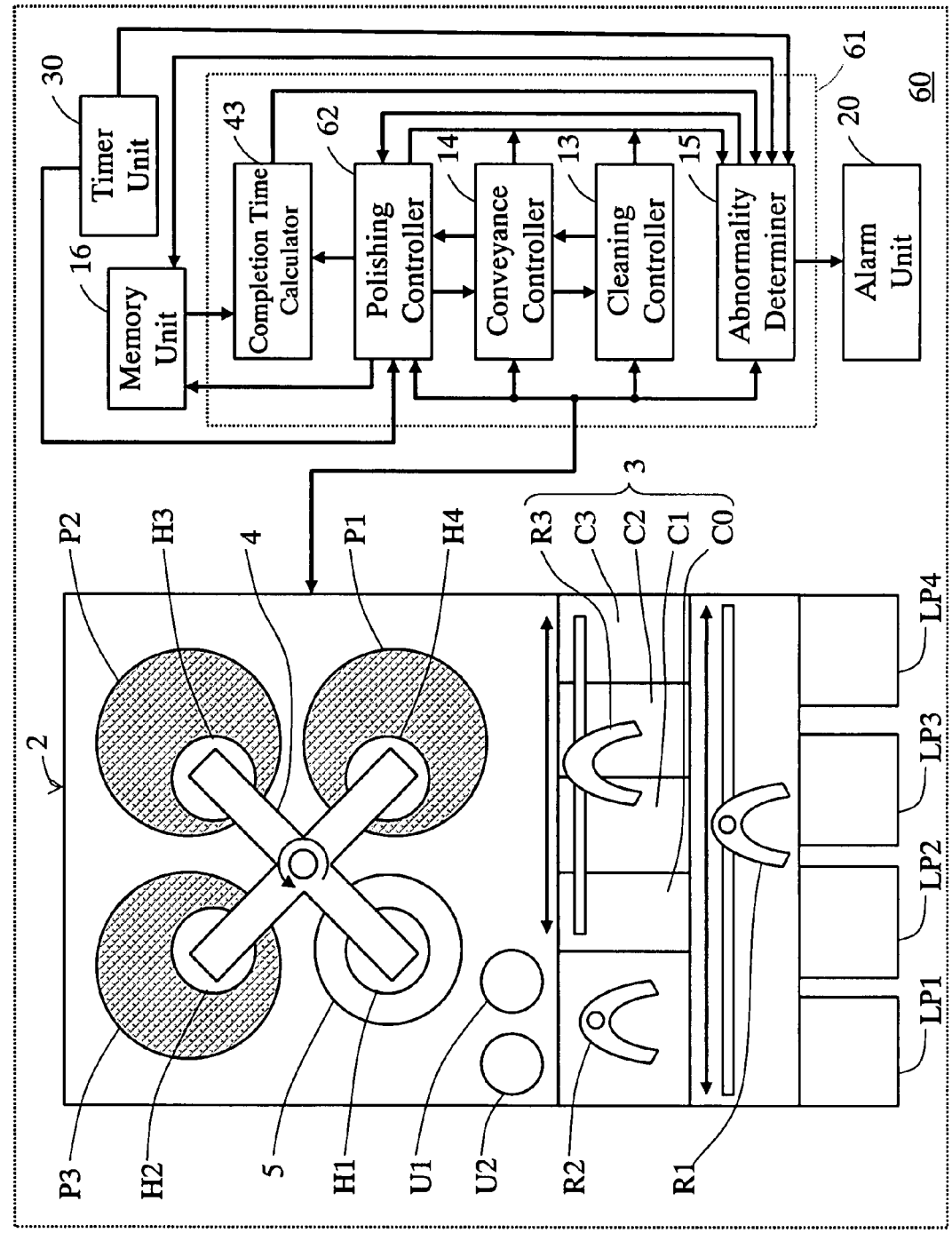
FIG. 6 is a schematic block diagram showing a substrate processing apparatus in the third embodiment relating to the present invention.

FIG. 6 is a schematic block diagram showing a substrate processing apparatus in the third embodiment relating to the present invention. As shown in FIG. 6, a substrate processing apparatus 60 in the present embodiment polishes wafers using three platens, as similar to the substrate processing apparatuses 10 and 40 described in the first and second embodiments. The substrate processing apparatus 60 includes a polishing controller 62 that changes polishing conditions for the polishing platens P1 to P3, respectively, based upon an expected polishing completion time for the polishing platens P1 to P3 calculated by the completion time calculator 43, respectively, instead of the polishing controller 42, and this is a point of difference compared to the substrate processing apparatus 40. The other configurations are the same as those of the substrate processing apparatus 40 in the second embodiment. In FIG. 6, the elements shown in FIG. 4 are marked with the same symbols, and any detailed descriptions about them will be omitted hereafter.

In the substrate processing apparatus 60 of the present embodiment, as similar to the substrate processing apparatus 40 in the second embodiment, when polishing of the first wafer W1 in a lot (a group of wafers stored in the same FOUP) by the third polishing platen P3 is started, the completion time calculator 43 calculates an expected polishing completion time of the polishing, which is currently conducted by the polishing platens P1 to P3, respectively. The expected polishing completion time is expected according to the calculation based upon a polishing start time and a polishing completion time of the polishing, which has already been completed by the polishing platens P1 to P3, previously, and which are stored in the memory unit 16, as described in the second embodiment. Furthermore, a database of the manufacturing execution system (MES) for controlling the production in the semiconductor device manufacturing process is stored in the memory unit 16, and it is configured that various polishing conditions and cleaning conditions according to the product types of the semiconductor devices formed on the wafer are readable.

Figure 7:
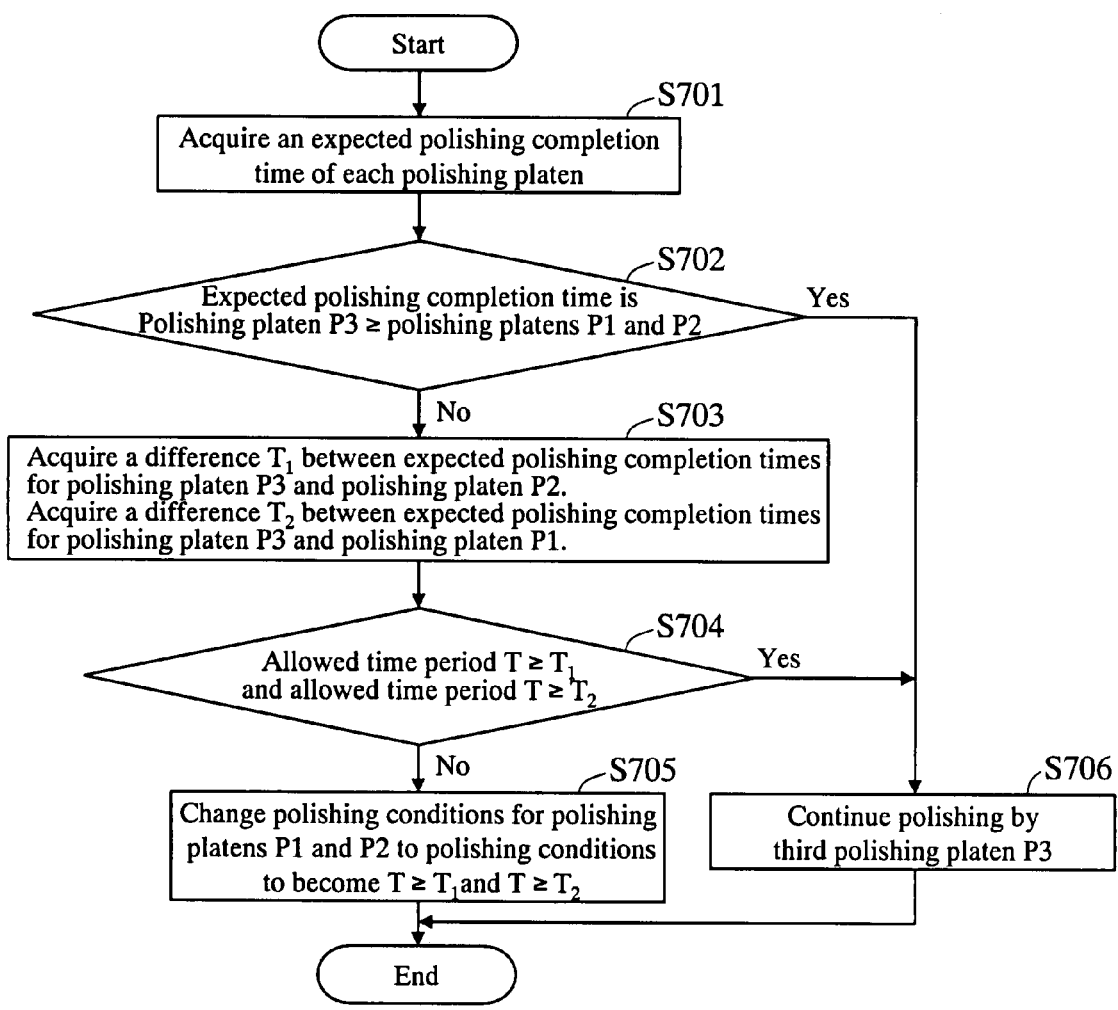
FIG. 7 is a flowchart showing abnormality determination processing in the third embodiment relating to the present invention.

FIG. 7 is a flowchart showing the processing to be implemented by the abnormality determiner 15 in the substrate processing apparatus 60. As shown in FIG. 7, the abnormality determiner 15 compares and determines which one comes first between an expected polishing completion time for the third polishing platen P3 and an expected polishing completion time for the first and second polishing platens P1 and P2, respectively, based upon the expected polishing completion times for the polishing platens P1 to P3 obtained by the completion time calculator 43 (Step S701, Step S702). When the expected polishing completion time for the third polishing platen P3 comes after the expected polishing completion times for the first and second polishing platens P1 and P2, respectively, the abnormality determiner 15 does nothing, and the polishing that has already been started by the polishing platens P1 to P3 is continued (Step S702 Yes, Step S706), respectively.

In the meantime, when the expected polishing completion time for the third polishing platen P3 comes before the expected polishing completion times for the first and second polishing plates P1 and P2, respectively, the abnormality determiner 15 acquires a time period $T_1$ where the expected polishing completion time for the third polishing platen P3 is subtracted from the expected polishing completion time for the second polishing platen P2. Similarly, the abnormality determiner 15 acquires a time period $T_2$ where the expected polishing completion time for the third polishing platen P3 is subtracted from the expected polishing completion time for the first polishing platen P1 (Step S702 No, Step S703). Then, the abnormality determiner 15 compares the pre-set allowed time period T and the difference $T_1$, $T_2$, respectively, and determines which one is greater (Step S704). Here, the allowed time period T is the upper limit of an allowed time period where the completely polished wafer can be exposed to the ultrapure water on the third polishing platen P3.

When the allowed time period T is greater than both of the difference $T_1$ and the difference $T_2$, the conveyance of the completely polished wafer is started within the allowed time period T. In this case, the abnormality determiner 15 does nothing, and the polishing by the polishing platens P1 to P3, which has already been started, is continued (Step S704 Yes, Step S706), respectively. In the meantime, when at least either the difference $T_1$ or the difference $T_2$ is greater than the allowed time period T, the conveyance of the completely polished wafer is not started within the allowed time period T. Therefore, even if the polishing that has already been started by the polishing platens P1 to P3, respectively, is continued, the corrosion caused by the long-term attachment of the ultrapure water onto the wafer surface occurs to the copper wiring. In this case, the abnormality determiner 15 notifies the polishing controller 62 of the abnormality occurrence. The notified polishing controller 62 changes the polishing conditions for the polishing, which has already been started by the first and second polishing platens P1 and P2, to conditions becoming the allowed time period T≧the difference $T_1$ and the allowed time period T≧the difference $T_2$, based upon the difference $T_1$ and the difference $T_2$ calculated by the abnormality determiner 15. In other words, the polishing time period for the first polishing platen P1 and/or the second polishing platen P2, which does not satisfy the condition, becomes shortened (Step S704 No, Step S705).

The polishing conditions for shortening this polishing time period can be determined, for example, based upon the Preston formula expressed in the formula (4). In other words, the polishing time period t for obtaining the predetermined polishing amount M is shorted by an increase of polishing pressure p, an increase of polishing relative velocity v, or an increase of coefficient η by increasing a slurry flow rate. It is acceptable as long as the reduction in the polishing time period satisfies the conditions where $T \geq T_1$ and $T \geq T_2$, and for example, the polishing time period can be shortened by the time period $T_1-T$ (or the time period $T_2-T$). Further, a configuration where the polishing controller 62 selects the polishing condition to satisfy $T \geq T_1$ and $T \geq T_2$ from the memory unit 16 can also be adopted not based upon the Preston formula. In this case, the polishing conditions for realizing a different polishing velocity per substrate, which is an object for polishing, are stored in the memory unit 16.

With this configuration, the differences $T_1$ and $T_2$ satisfy the conditions where $T \geq T_1$ and $T \geq T_2$. As a result, in the third polishing platen P3, the time period where the surface of the complete polished wafer is exposed to the ultrapure water can be kept within the allowed time period T. Therefore, the corrosion of the copper wiring can be prevented.

In the meantime, when polishing of the wafer W1 by the third polishing platen P3 is continued without stoppage, the polishing is conducted until a polishing end point for the third polishing platen P3 is detected using the end point detection method, which was described in the first embodiment. The polishing controller 42 that has detected the polishing end point instructs the un-shown ultrapure water supplying unit to supply the ultrapure water to the surface of the third polishing platen P3, and the polishing slurry on the surface of the wafer W1 is removed. At this time, the polishing controller 42 acquires a polishing completion time for the third polishing platen P3 from the timer unit 30, and stores the time to the memory unit 16. Furthermore, when polishing by the polishing platens P1 to P3 is continued, respectively, a time period to attach the ultrapure water onto the surface of the wafer where the final stage polishing has been completed becomes within the allowed range. Therefore, the corrosion of the copper wiring caused by the long-term attachment of the ultrapure water can be restrained.

Furthermore, the wafer conveyance after the completion of polishing by the third polishing platen P3 is as described in the first embodiment, so any description about this is omitted herein.

Further, this technique can also be applied to a case of consecutively polishing multiple lots containing different product types. For example, when a last wafer in the first lot is situated on the third polishing platen P3, a first wafer in the second lot is arranged on the second polishing platen P2. Further, a second wafer in the second lot is arranged on the first polishing platen P1. At this time, even if the polishing is complete, the last wafer in the first lot will not be conveyed to the cleaning section 3 until the polishing of the first and second wafers in the second lot is completed. Therefore, when polishing time period for the first and second polishing platens P1 and P2 is obviously greater than the polishing time period for the third polishing platen P3, respectively, the surface of the last wafer in the first lot is exposed to the ultrapure water for a long time, so corrosion occurs to the copper wiring. Even under this situation, according to the present embodiment, if the polishing time period for the first and second polishing platens is changed, the time period for the surface of the last wafer in the first lot to be exposed to the ultrapure water can be kept within the allowed time period T.

Furthermore, associated with the recent miniaturization of semiconductor devices, the number of metal wiring layers comprising the semiconductor device is increasing. Because the wiring structure and the wiring density vary per metal wiring layer, the Cu film thickness and the barrier film thickness vary per metal wiring layer. In the recent semiconductor manufacturing plants where small lots with many product types are produced, semiconductor devices with different product types are often consecutively produced in the same substrate processing apparatus. Therefore, when structures of wafers belonging to lots to be consecutively processed are extremely different, if the polishing conditions are changed as described above, it may become difficult to adjust the polishing time period. Consequently, for the polishing processing of product types and layers, which require much time to remove a Cu film (polishing by the first and second polishing platens), it is preferable to dispatch the lots so as not to consecutively process the lots.

Furthermore, the substrate processing unit 60 also has the function to confirm whether or not the wafer conveyance to the cleaning section 3 after the completion of the final stage polishing is completed within a time period, which is a premise on the occasion of setting the allowed time period T, as similar to the substrate processing apparatus 40 in the second embodiment. Further, in the embodiment mentioned above, it is configured that the polishing controller 62 changes the polishing velocity of the first and second polishing platens P1 and P2; however, it can also be configured that the polishing velocity of the third polishing platen P3 is changed instead of that of the first and second polishing platens. In this case, in order to satisfy the conditions, $T \geq T_1$ and $T \geq T_2$, the polishing controller 62 slows the polishing velocity of the third polishing platen P3 down.

As described above, according to the present embodiment, the time period to attach the ultrapure water onto the surface of the wafer where the final stage polishing has been completed can be a predetermined time period or less. As a result, the corrosion of the copper wiring can be restrained. Further, in the present embodiment, when the wafer after the polishing platen for the final stage polishing is not normally conveyed, the polishing is stopped. Consequently, even when some abnormality occurs to the substrate processing apparatus, the continuous corrosion of the copper wiring can be prevented.

Fourth Embodiment

In the third embodiment, the configuration where the time period from the completion of the final stage polishing until the start of the first cleaning processing is adjusted to be within a predetermined time was described. Here, another configuration where the predetermined time period can be relaxed is described.

Figure 8:
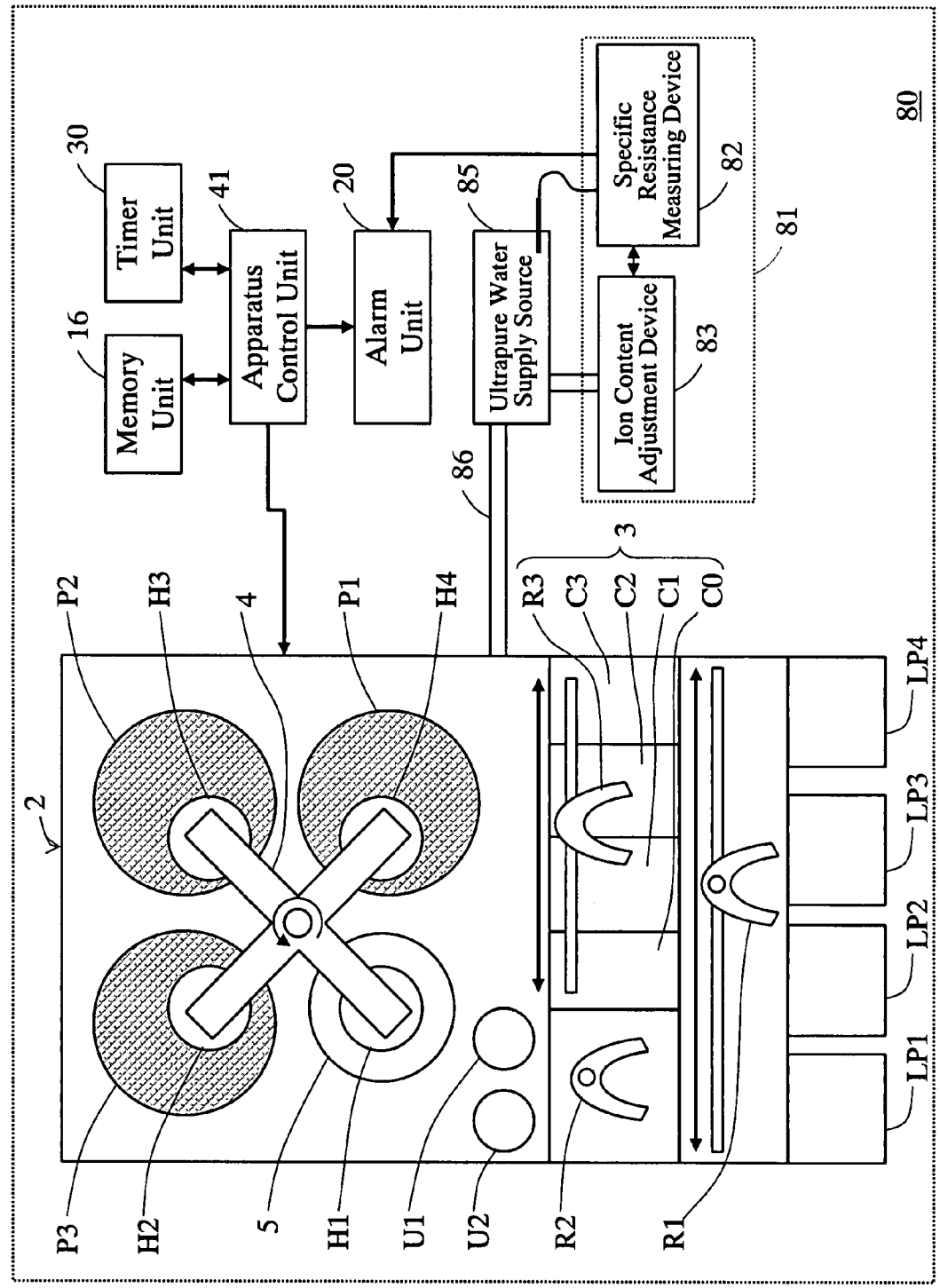
FIG. 8 is a schematic block diagram showing a substrate processing apparatus in the fourth embodiment relating to the present invention.

FIG. 8 is a schematic block diagram showing a substrate processing apparatus in the fourth embodiment relating to the present invention. As shown in FIG. 8, a substrate processing apparatus 80 in the present embodiment polishes wafers using three platens in stages, as similar to the substrate processing apparatuses 10, 40 and 60 described in the first to third embodiments. Further, the substrate processing apparatus 80 includes an ion content adjustment unit 81 that adds ions to the ultrapure water to be supplied onto the polishing platen in the final stage in addition to the configurations of the substrate processing apparatus 40 described in the second embodiment. Also, the ion content adjustment unit 81 maintains the ion content in the ultrapure water to be consistent.

The ion content adjustment unit 81, for example, can be included in an ultrapure water supply source 85 that stores the ultrapure water to be supplied to the polishing platen from the ultrapure water supplying unit. Furthermore, although the ultrapure water is highly-purified water not containing ions, here, the ultrapure water where ions are intentionally added is expressed as "ultrapure water containing ions". The other configurations of the substrate processing apparatus 80 are the same as those of the substrate processing apparatus 40 in the second embodiment. Furthermore, in FIG. 8, the same elements shown in FIG. 4 are marked with the same symbols, and any detailed descriptions about them are omitted hereafter. Further, in FIG. 8, the detailed configuration of the apparatus control unit 41 is omitted; however, the apparatus control unit 41 has the configuration shown in FIG. 4.

As shown in FIG. 8, the ion content adjustment unit 81 includes a specific resistance measuring device 82 and an ion content adjustment device 83. The ion content adjustment device 83 adds ions so as to be in the condition where the specific resistance of the ultrapure water detected by the specific resistance measuring device 82 becomes a predetermined value, and produces ultrapure water containing ions. In the present embodiment, the ultrapure water containing ions within the ultrapure water supply source 85 is supplied to the ultrapure water supplying unit arranged in the polishing section 2 via a pipe 86. The ultrapure water containing ions may be supplied to all of the polishing platens P1 to P3; however, here, it is configured to supply to only the third polishing platen P3.

For the ions to be added to the ultrapure water, metal ion simple substances, such as Cu ions or Al ions, or NaCl (Na ions and Cl ions) can be used. Here, the ion content adjustment device 83 adjusts the ion content in the ultrapure water containing ions so as to have approximately 8 to 15 Mohm·cm of the specific resistance of the ultrapure water containing ions by adding NaCl to the ultrapure water. Furthermore, the specific resistance of the ultrapure water containing ions should be conventionally smaller than approximately 18 Mohm·cm, which is the specific resistance of the ultrapure water to be supplied to wafers after the completion of CMP polishing, and it is not particularly limited. Further, for the ion content adjustment unit 81, as long as it is configured that the specific resistance of the ultrapure water containing ions can be maintained at a consistent value, based upon an output value of the specific resistance measuring device 82, the configuration is not limited.

As described in each of the embodiments, in the substrate processing apparatus 80 shown in FIG. 8, even if the polishing by the third polishing platen P3 is complete, the conveyance of the completely polished wafers is not started until the polishing by the other polishing platens P1 and P2 is completed. Consequently, the polishing time period for the first polishing platen P1 or the second polishing platen P2 is greater than that for the third polishing platen P3, the completely polished wafer on the third polishing platen P3 will be on stand while the ultrapure water is supplied onto the third polishing plate P3.

Figure 9A:
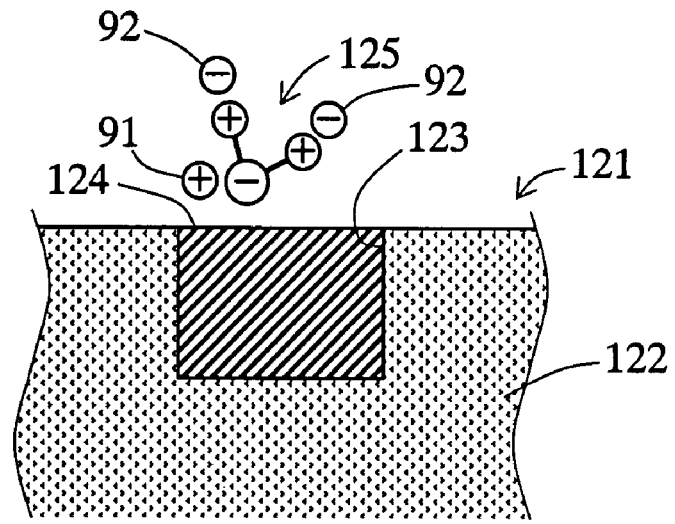
FIG. 9A and FIG. 9B are pattern diagrams showing a mechanism of corrosion restraint in the fourth embodiment relating to the present invention.
Figure 9B:
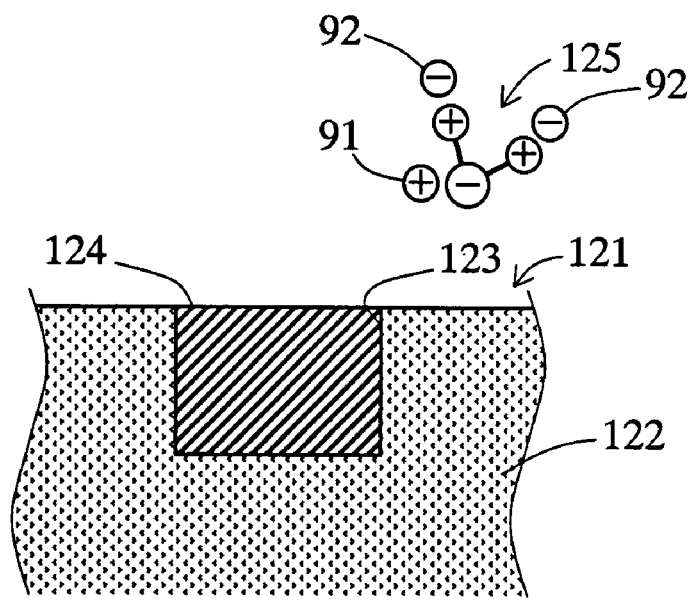
Figure 12A:
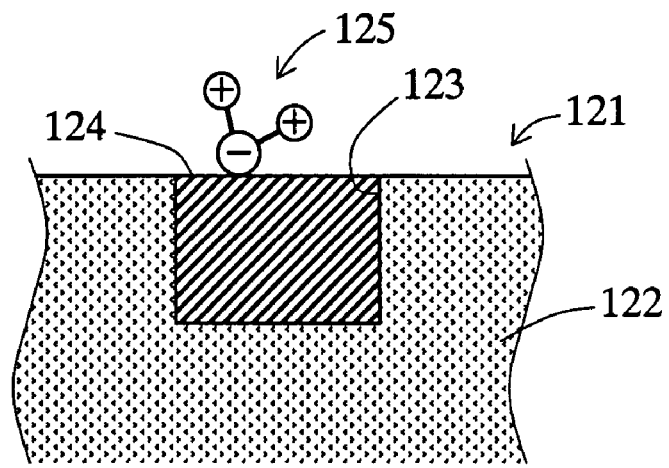
FIG. 12A and FIG. 12B are pattern diagrams showing an occurrence mechanism of corrosion under a shielding condition.
Figure 12B:
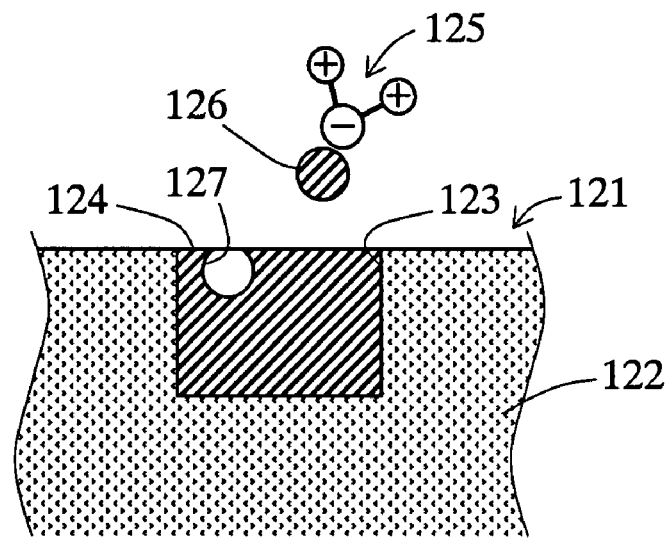

At this time, water molecules in the ultrapure water containing ions make contact with the electrically-disconnected copper wiring on the surface of the completely polished wafer. As described above, the corrosion of the copper wiring occurs caused by polarization of water molecules in the ultrapure water. FIG. 9A and FIG. 9B are pattern diagrams showing the states where the water molecules in the ultrapure water containing ions make contact with the copper wiring. As similar to an example shown in FIG. 12, a wafer 121 where the final stage polishing has been completed has a structure where copper wiring 124 is buried into a trench 123 formed in an interlayer insulating film 122 made from an oxide film.

For example, when NaCl is mixed, as shown in FIG. 9A, a Na ion (cation) forms a covalent binding with an oxygen atom (at the negatively polarized side) in a water molecule 125. Further, a Cl ion (anion) 92 forms another covalent binding with a hydrogen atom (at the positively polarized side) in the water molecule 125. As a result, the polarization of the water molecule 125 is relaxed in the ultrapure water containing ions. Therefore, as shown in FIG. 9B, even if the water molecule 125 is attached onto the copper wiring 124, the frequency to deprive the copper atoms comprising the copper wiring 124 of electrons is lowered. Consequently, a phenomenon where the copper atoms are ionized and dissolved into the ultrapure water containing ions can be restrained. As a result, the corrosion of the copper wiring 124 is restrained.

Therefore, adopting the configuration where the ultrapure water containing ions is supplied to a completely polished wafer on the third polishing platen P3 enables the restraint of the corrosion occurrence to the copper wiring, compared to the case where the ultrapure water not containing ions is supplied to a completely polished wafer. In other words, in the dependency of the corrosion of the copper wiring upon the attachment time period to ultrapure water shown in FIG. 11, the time period to allow the corrosion can be relatively extended.

Furthermore, when metal ions (cation) are added to the ultrapure water, although there is no ion to form a covalent binding with hydrogen atoms (at the positively polarized side) in the water molecule, there are ions to form a covalent binding with oxygen atoms (at the negatively polarized side). Consequently, at least the polarization at the oxygen atom side can be relaxed. Therefore, as similar to the case where NaCl is added, the corrosion of the copper wiring can be prevented.

Furthermore, in addition to the configuration, it is needless to say, the ultrapure water containing ions can be supplied from the ultrapure water supplying unit to discharge the ultrapure water to a wafer on a conveyance route from the polishing section 2 to the cleaning section 3.

Further, in the case described above, the configuration where the ultrapure water containing ions is always supplied onto the polishing platen P3 at the time of polishing completion was described. However, it can also be configured that the ultrapure water containing ions is supplied only when the conveyance reserve occurs. In this case, the ultrapure water supplying unit for the third polishing platen P3 has a mechanism to supply the ultrapure water by switching between the ultrapure water not containing ions and the ultrapure water containing ions. Then, when the conveyance reserve occurs to the wafer where the polishing by the third polishing platen P3 has been completed, the ultrapure water containing ions is supplied, and when the conveyance reserve does not occur, the ultrapure water not containing ions is supplied.

Furthermore, the occurrence of the conveyance reserve can be easily detected by mutually comparing the expected polishing completion time for the polishing platens P1 to P3 calculated by the completion time calculator 43 in the apparatus control unit 41 as described above. For example, it can be configured that the expected polishing completion time is compared by the abnormality determiner 15. In this case, only when the abnormality determiner 15 detects the occurrence of the conveyance reserve in the third polishing platen P3, the ultrapure water supplying unit supplies the ultrapure water containing ions onto the third polishing platen P3.

Further, when trouble occurs to the ion content adjustment device 83, in order to prevent the corrosion of the copper wiring, it is preferable to adopt a configuration where if the specific resistance of the ultrapure water containing ions measured by the specific resistance measuring device 82 is different from a pre-set specific resistance, the alarm unit 20 issues an alert and the polishing in the polishing section 2 is stopped.

Fifth Embodiment

In the substrate processing apparatuses in each of the embodiments, it is configured that even when polishing by the third polishing platen P3 is complete, the completely polished wafer is not conveyed until the polishing by the other polishing platens P1 and P2 is completed. This situation is caused by the wafer conveyance among the polishing platens P1 to P3 and the load-unload unit 5 by a set of the rotating head mechanism 4. Then, in the present embodiment, a configuration including a wafer conveyance unit that conveys the wafer where the final stage polishing has been completed independently from the rotating head mechanism 4 is adopted.

Figure 10:
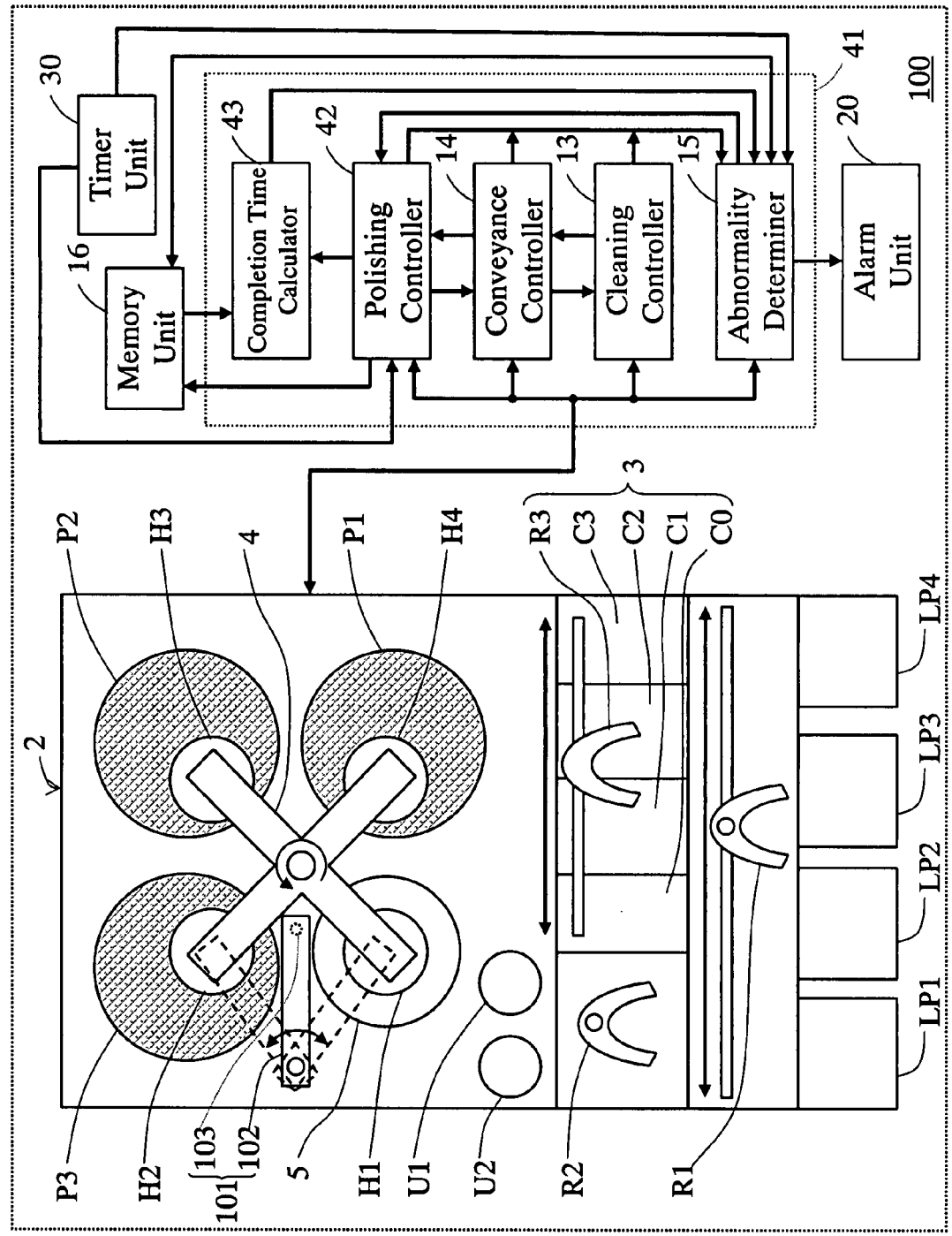
FIG. 10 is a schematic block diagram showing the substrate processing apparatus in the fifth embodiment relating to the present invention.

FIG. 10 is a schematic block diagram showing the substrate processing apparatus in the fifth embodiment relating to the present invention. As shown in FIG. 10, a substrate processing apparatus 100 of the present embodiment polishes wafers using three polishing platens in stages, as similar to the substrate processing apparatuses 10, 40, 60 and 80 in each of the embodiments mentioned above. Further, the substrate processing apparatus 100 includes a final stage conveyance mechanism 101 between the third polishing platen 3 and the load-unload unit 5 for conveying a wafer from the third polishing platen P3 to the load-unload unit 5.

The final stage conveyance mechanism 101 includes an arm 102 that is formed to be reciprocable by extending from the upper side of the third polishing platen P3 and the upper side of the load-unload unit 5. An adsorption unit 103 that adsorbs a wafer at the lower surface of the arm 102 by vacuum contact is arranged at the lower surface side at the end of the arm 102. Further, the arm 102 is configured to be movable up and down with regard to the upper surface of the third polishing platen P3 and the upper surface of the load-unload unit 5. In addition, the arm 102 is movable without coming into collision with the other members comprising the polishing section 2 within a horizontal plane, which is positioned at the lower side from the heads H1 to H4 at the elevation positions and at the upper side from the upper surface of the third polishing platen P3 and the upper surface of the load-unload unit 5. The other configurations of the substrate processing apparatus 100 are the same as that of the substrate processing apparatus 40 in the second embodiment. Furthermore, it is configured such that the movement of the final stage conveyance mechanism 101 is controlled by the conveyance controller 14 of the apparatus control unit 41. Further, in FIG. 10, the same elements shown in FIG. 4 are marked with the same symbols, and any detailed descriptions about them are omitted hereafter.

In the substrate processing apparatus 100, a case where the wafer W1 is polished by the head H1 in the polishing platen P3 is described. At this time, in the second polishing platen P2, the wafer W2 is polished by the head H2, and in the first polishing platen P1, the wafer W3 is polished by the head H3. As described in the second embodiment, when polishing by the polishing platens P1 to P3 is started, respectively, the completion time calculator 43 of the apparatus control unit 41 calculates an expected polishing completion time for the polishing platens P1 to P3, respectively. The acquired the expected polishing completion time is transmitted to the abnormality determiner 15, respectively. The abnormality determiner 15 mutually compares each polishing completion time.

At this time, the expected polishing completion time for the polishing platen P3 comes after the polishing completion time for the other polishing platens P1 and P2, respectively, the final stage conveyance mechanism 101 is not used, but a wafer is conveyed by the rotating head mechanism 4 as described above. In the meantime, the expected polishing completion time for the polishing platen P3 comes before the expected polishing completion time for the other polishing platens P1 and P2, respectively, the abnormality determiner 15 notifies the conveyance controller 14 of the result.

The polishing proceeds, and if the polishing controller 42 detects the polishing completion by the third polishing platen P3 using the aforementioned technique, the polishing controller 42 notifies the conveyance controller 14 of the detection result. The notified conveyance controller 14 cancels the wafer adsorption to the head (the head H1 herein) positioned on the third polishing platen P3. At the same time, the head is ascended. When the head ascent is complete, the conveyance controller 14 instructs the final stage conveyance mechanism 101 to convey the completely polished wafer on the third polishing platen P3. Based upon the instruction, after the final stage conveyance mechanism 101 moves the arm 102 to the upper side of the third polishing platen P3, the arm 102 is lowered. Then, the wafer is adsorbed to the adsorption part 103.

When the wafer adsorption is complete, after the final stage conveyance mechanism 101 moves the arm 102 to the upper side of the load-unload unit 5, the arm 102 is lowered. At this time, since a next wafer W4 is adsorbed onto the head H4 and is in reserve at the upper side of the load-unload unit 5, the next wafer W4 will never inhibit the wafer conveyance. Subsequently, the adsorption of the adsorption part 103 is cancelled, and the completely polished wafer is mounted onto the load-unload unit 5. The final stage conveyance mechanism 101 that has completed the conveyance to the load-unload unit 5 moves the arm 102 to an intermediate position between the third polishing platen P3 and the load-unload unit 5, and the operation is completed. Subsequently, the completely polished wafer is conveyed to the cleaning section 3. Because the conveyance is as described above, any description about this will be omitted herein.

Further, hereafter, when polishing by the first polishing platen P1 and the second polishing platen P2 is complete, the rotating head mechanism 4 is rotated based upon an instruction by the conveyance controller 14, and the wafer is conveyed. At this time, since the wafer is not retained by the head H1, the conveyance controller 14 omits a releasing operation of the wafer from the head H1. When a next wafer W5 is conveyed into the load-unload unit 5, the wafer adsorption is operated as described above.

As described above, according to the present embodiment, when polishing by the third polishing platen is complete, even if the polishing by the other polishing platens P1 and P2 is not completed, the completely polished wafer can be conveyed. In other words, the wafer where the final stage polishing has been completed can be immediately conveyed, and the time period for the wafer surface to expose to the ultrapure water after the completion of the final stage polishing can be shortened. As a result, the corrosion of the copper wiring can be restrained.

Further, the present invention shall not be limited to the embodiment described above, and various modifications and applications are possible within the effective scope of the present invention. For example, the number of the polishing platens is not limited to three, but any plural number is acceptable. Further, the configurations described in each of the embodiments do not have to be singularly used, but they can be adopted with any combination.

Further, the substrate processing apparatuses for CMP polishing and cleaning of wafers were described. However, if electrically-disconnected corrodible metal, such as copper, is formed on a wafer surface and ultrapure water is attached to the wafer surface, corrosion occurs. Therefore, the present invention is not limited to the substrate processing apparatus for CMP polishing, but it is utilizable for a corrosion prevention technology on a wafer surface by ultrapure water or chemicals.

The present invention demonstrates an efficacy enabling the corrosion restraint of corrodible metal wiring, and is useful for a substrate processing apparatus and a substrate processing method.

While the invention has been shown and described in detail, the foregoing description is in all aspects illustrative and not restrictive. It is therefore understood that numerous modifications and variations can be devised without departing from the scope of the invention.

The invention claimed is:

1. A substrate processing method that polishes a substrate, where a metal film is formed on a surface to be polished, using chemical mechanical polishing and that consecutively cleans the polished substrate, comprising the steps of:
    polishing the substrate which is sequentially arranged onto each of multiple polishing platens for polishing the metal film in stages;
    cleaning the substrate, which has been polished by the polishing platen for a final stage polishing of the multiple polishing platens, that starts within a predetermined time period from completion of polishing by the polishing platen for the final stage polishing; and
    supplying an ion containing solution containing intentionally added ions onto the substrate after the completion of the final stage polishing and before a start of the cleaning.

2. A substrate processing method according to claim 1, wherein the predetermined time period is set based upon a pre-acquired relation between production yield and elapsed time from the completion of polishing by the polishing platen for the final stage polishing, so as to obtain a predetermined production yield.

3. A substrate processing method according to claim 1, wherein the cleaning step is comprised of a plurality of cleaning processings conducted by different cleaning units in sequence and a plurality of substrates is sequentially processed; and wherein
    the polishing step is implemented under polishing conditions where a polishing time period by the polishing platen for the final stage polishing is longer than a polishing time period by another polishing platen, and each of the plurality of cleaning processings is implemented within each cleaning time set so as not to generate a waiting time for conveyance of each of the plurality of substrates between each of the cleaning processings; and
    the polishing step and the cleaning step are implemented under conditions where a time period from a start of polishing for one substrate by the polishing platen for the final stage polishing until the completion of the conveyance of the one substrate to the cleaning unit for a first cleaning processing of the plurality of cleaning processings is longer than a cleaning time period set on the cleaning unit for the first cleaning processing and a ratio of the both time periods becomes an irrational number.

4. A substrate processing method according to claim 2, wherein the cleaning step is comprised of a plurality of cleaning processings conducted by different cleaning units in sequence and a plurality of substrates is sequentially processed; and wherein
    the polishing step is implemented under polishing conditions where a polishing time period by the polishing platen for the final stage polishing is longer than a polishing time period by another polishing platen, and each of the plurality of cleaning processings is implemented within each cleaning time set so as not to generate a waiting time for conveyance of each of the plurality of substrates between each of the cleaning processings; and
    the polishing step and the cleaning step are implemented under conditions where a time period from a start of polishing for one substrate by the polishing platen for the final stage polishing until the completion of the conveyance of the one substrate to the cleaning unit for a first cleaning processing of the plurality of cleaning processings is longer than a cleaning time period set on the cleaning unit for the first cleaning processing and a ratio of the both time periods becomes an irrational number.

5. A substrate processing method according to claim 1, wherein, when a plurality of substrates is sequentially processed,
    the cleaning step is started within the predetermined time by changing the polishing conditions for each polishing platen so as to adjust an expected polishing completion time for each polishing platen when a time difference between an expected polishing completion time to polish one substrate by the polishing platen for the final stage polishing and an expected polishing completion time to polish another substrate by another polishing platen, those polishings being simultaneously conducted, is not within an allowed range corresponding to the predetermined time period.

6. A substrate processing method according to claim 2, wherein, when a plurality of substrates is sequentially processed,
    the cleaning step is started within the predetermined time by changing the polishing conditions for each polishing platen so as to adjust an expected polishing completion time for each polishing platen when a time difference between an expected polishing completion time to polish one substrate by the polishing platen for the final stage polishing and an expected polishing completion time to polish another substrate by another polishing platen, those polishings being simultaneously conducted, is not within an allowed range corresponding to the predetermined time period.

7. A substrate processing method according to claim 5, wherein
    when the cleaning step cannot be started within the predetermined time due to a different structures of surfaces to be polished of each substrate processed simultaneously even when the polishing conditions for the each polishing platen are changed, each substrate is processed after being respectively allocated to lots where each substrate will never be consecutively processed.

8. A substrate processing method according to claim 6, wherein when the cleaning step cannot be started within the predetermined time, due to a different structures of surfaces to be polished of each substrate processed simultaneously even when the polishing conditions for the each polishing platen are changed, each substrate is processed after being respectively allocated to lots where each substrate will never be consecutively processed.

9. A substrate processing method according to claim 1, further comprising the step of:
    producing the ion containing solution by adding a salt to ultrapure water.

10. A substrate processing method according to claim 9, wherein the salt added in the step of producing the ion containing solution comprises Cu, Al, Na, or Cl ions.

11. A substrate processing method according to claim 9, wherein
    the specific resistance of the ion containing solution is approximately 8 to 18 Mohm·cm.

* * * * *